(12) United States Patent
Yokoi

(10) Patent No.: US 7,061,097 B2
(45) Date of Patent: Jun. 13, 2006

(54) SEMICONDUCTOR DEVICE AND MANUFACTURING METHOD FOR THE SAME

(75) Inventor: Tetsuya Yokoi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 10/801,559

(22) Filed: Mar. 17, 2004

(65) Prior Publication Data

US 2005/0151235 A1 Jul. 14, 2005

(30) Foreign Application Priority Data

Jan. 14, 2004 (JP) .............................. 2004-006787

(51) Int. Cl.
*H01L 23/12* (2006.01)
*H01L 23/053* (2006.01)

(52) U.S. Cl. ...................................... 257/700; 257/778

(58) Field of Classification Search ................ 257/690, 257/700, 778
See application file for complete search history.

(56) References Cited

U.S. PATENT DOCUMENTS 6,724,061 B1 * 4/2004 Murata ........................ 257/433
6,822,323 B1 * 11/2004 Kim et al. ................... 257/700

FOREIGN PATENT DOCUMENTS

| JP | 11-186492 | 7/1999 |
| JP | 2000-68444 | 3/2000 |
| JP | 2001-332681 | 11/2001 |
| JP | 2002-151644 | 5/2002 |
| JP | 2003-86733 | 3/2003 |

OTHER PUBLICATIONS

Notification of Reasons for Rejection (Office Action) for Japanese Patent Application No. 2004-006787, mailed Jan. 17, 2006 and English translation thereof.

* cited by examiner

*Primary Examiner*—Phat X. Cao
*Assistant Examiner*—Theresa T. Doan
(74) *Attorney, Agent, or Firm*—Finnegan, Henderson, Farabow, Garrett & Dunner, L.L.P.

(57) ABSTRACT

There is here disclosed a semiconductor device comprising a semiconductor element, a first substrate disposed to face one side of the element, being provided first internal wirings on a main surface, and being provided first external wirings connected to the respective first internal wirings on another main surface, and a second substrate formed to be larger than the element by a material having flexibility, being disposed to face another side of the element, being provided second internal wirings having one-end portions extended to edges of a main surface, and the one-end portions connected to the first internal wirings with being bent toward the first substrate together with the edges, being mounted the element having an electrode connected to some of the second internal wirings on the main surface, and being provided external terminals connected to some of the second internal wirings on a middle of another main surface.

14 Claims, 19 Drawing Sheets

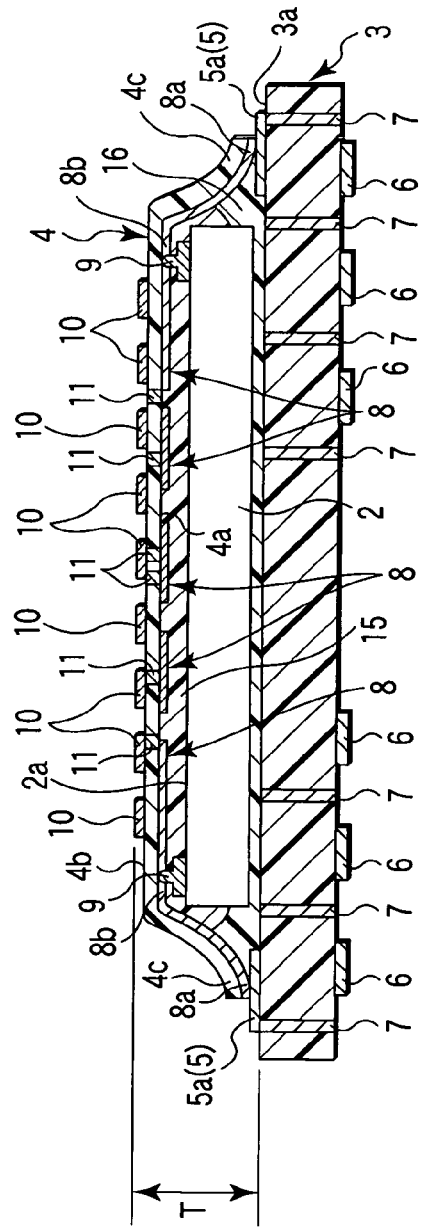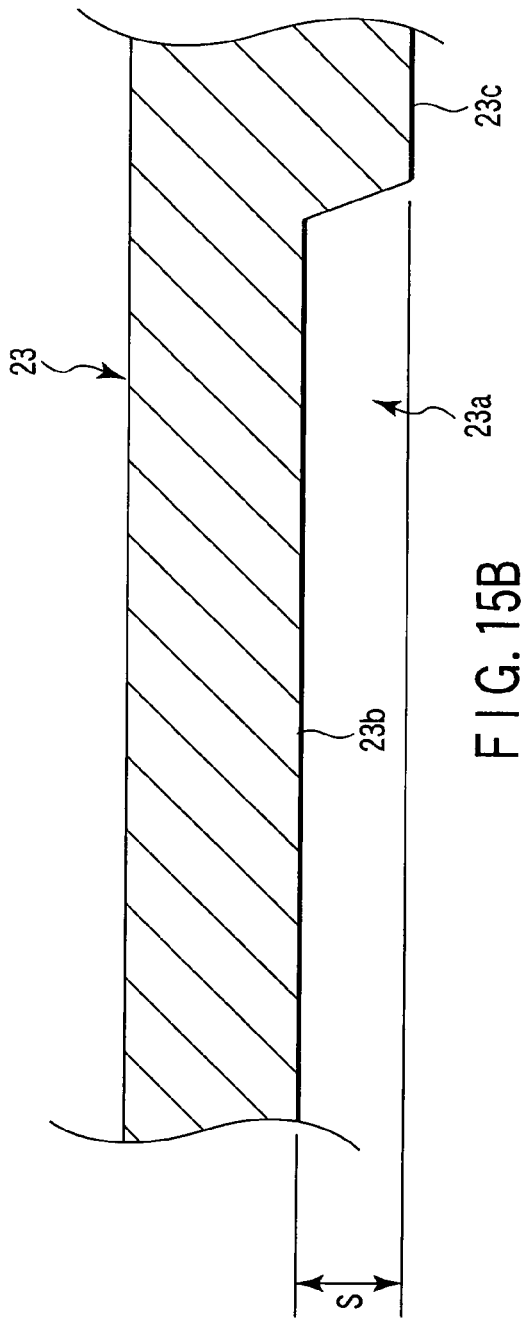
FIG. 15A
FIG. 15B

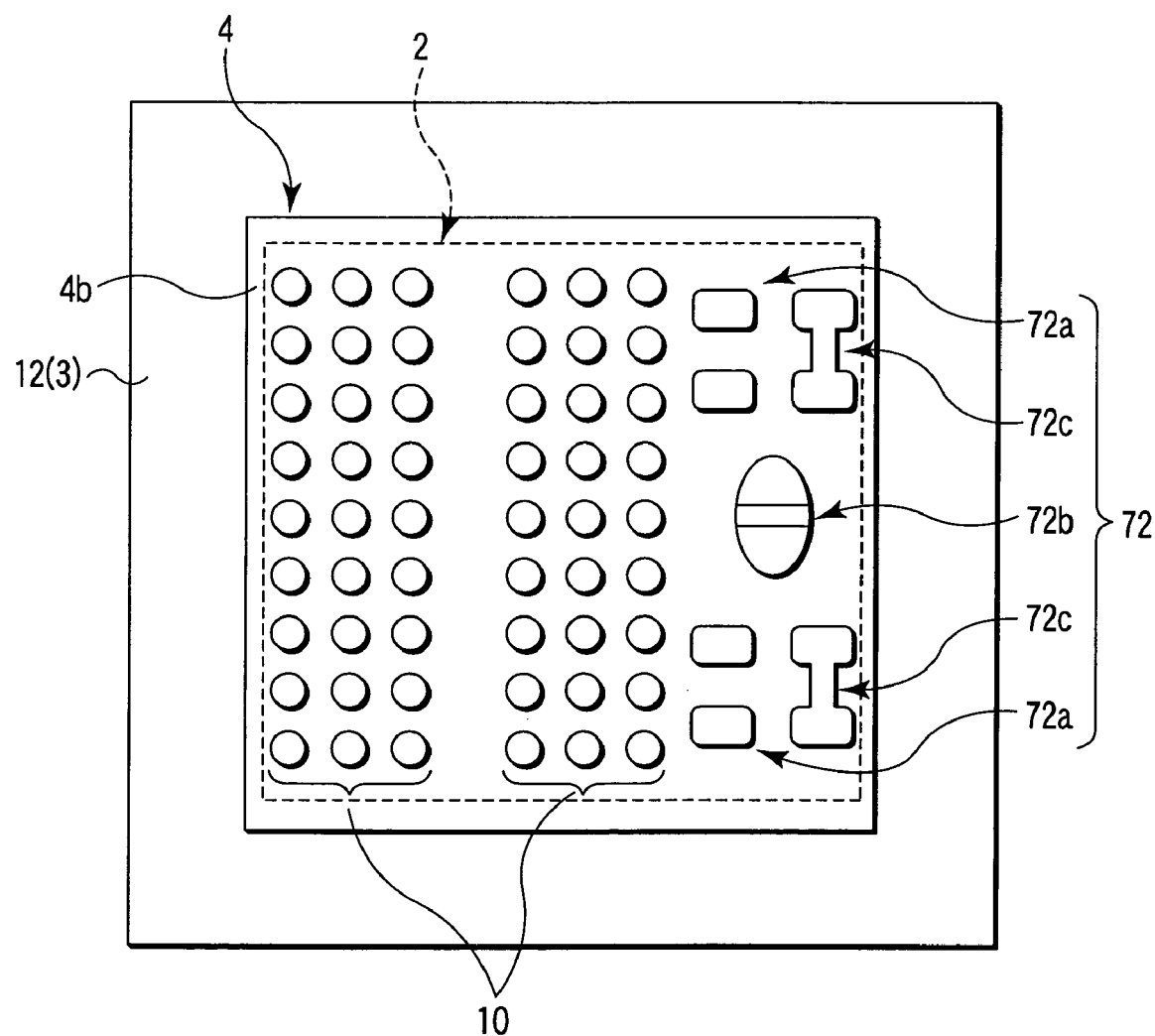
F I G. 23

SEMICONDUCTOR DEVICE AND MANUFACTURING METHOD FOR THE SAME

CROSS-REFERENCE TO RELATED APPLICATIONS

This application is based upon and claims the benefit of priority from prior Japanese Patent Application No. 2004-006787, filed Jan. 14, 2004, the entire contents of which are incorporated herein by reference.

BACKGROUND OF THE INVENTION

1. Field of the Invention

The present invention relates to a mounting technique of a semiconductor device, particularly to a semiconductor device whose variations of performances and properties can be increased in a semiconductor device on which one or a plurality of semiconductor elements are mounted and to which another semiconductor device, a passive component and the like are added, and a manufacturing method for the semiconductor device.

2. Description of the Related Art

As a technique for mounting another semiconductor device onto a certain semiconductor device, several devices, structures, constitutions, and manufacturing methods have heretofore been proposed. The technique is described, for example, in Jpn. Pat. Appln. KOKAI Publication Nos. 11-186492, 2000-68444, 2001-332681, and 2002-151644.

In a general semiconductor device, a semiconductor element is mounted on substantially a middle part with respect to an outer configuration. Moreover, a periphery of the semiconductor element is sealed with a resin. Therefore, when another semiconductor device is connected and mounted onto the certain semiconductor device, an upper connection terminal needs to be disposed outside a lower semiconductor element in order to prevent the upper connection terminal for connecting the upper semiconductor device to the lower semiconductor device from overlapping with the lower semiconductor element. That is, the upper connection terminal has to be disposed on an edge of the upper surface of the lower semiconductor device. Additionally, an outer configuration and a position of a lower connection terminal of the upper semiconductor device mounted on an upper part of the lower semiconductor device have to be adapted in accordance with the position of the upper connection terminal.

Moreover, in the general semiconductor device, the lower connection terminal is provided over the whole region of the lower surface. It is essentially preferable to be capable of mounting the general semiconductor device having much versatility as the upper semiconductor device onto the upper part of the lower semiconductor device. Additionally, as described above, the upper connection terminal of the general semiconductor device is provided on the edge of the upper surface. Therefore, it is difficult to stack the general semiconductor devices on each other as they are. Therefore, to stack a plurality of semiconductor devices, a need arises for especially preparing a semiconductor device whose outer configuration and whose arrangement of terminals for external connection are adapted in accordance with the outer configuration and the arrangement of the terminals for external connection of the lower semiconductor device as the upper semiconductor device. Also for the lower semiconductor device, a size of a semiconductor element to be mounted on the lower semiconductor device, or an amount of the resin for sealing the semiconductor element differs with a product. Therefore, types of semiconductor devices to be mounted on the upper part have to be increased in accordance with the types of the lower semiconductor device.

When the general-purpose semiconductor devices generally circulating in markets are combined and stacked as they are, restrictions on the combinations are made. For example, when a special semiconductor device is manufactured as the upper semiconductor device in order to remove the restrictions on the combination of the semiconductor devices, a rise of manufacturing cost or a drop of production efficiency is caused.

BRIEF SUMMARY OF THE INVENTION

According to an aspect of the invention, there is provided a semiconductor device comprising: at least one semiconductor element; a first substrate being disposed to face one main surface of the semiconductor element, being provided a plurality of first internal wirings on a main surface of the first substrate on a side facing the semiconductor element, and being provided a plurality of first external wirings being electrically connected to the respective first internal wirings on a main surface of the first substrate on a side opposite to the side facing the semiconductor element; and a second substrate being formed to be larger than both main surfaces of the semiconductor element by a material having flexibility, being disposed to hold the semiconductor element between the first substrate and the second substrate, being provided a plurality of second internal wirings having one-end portions extended to edges of a main surface of the second substrate on a side facing the semiconductor element on the main surface of the second substrate on the side facing the semiconductor element, and the one-end portions of the second internal wirings electrically connected to the first internal wirings with being bent toward the first substrate together with the edges of the second substrate on which the second internal wirings are provided, being mounted the semiconductor element having at least one electrode electrically connected to some of the second internal wirings on the main surface of the second substrate on the side facing the semiconductor element, and being provided a plurality of external terminals being electrically connected to some of the second internal wirings on at least a middle part of a main surface of the second substrate on a side opposite to the side on which the semiconductor element is mounted.

According to another aspect of the invention, there is provided a manufacturing method for a semiconductor device, comprising: disposing a first substrate to face a second substrate on whose one main surface at least one semiconductor element is mounted via the semiconductor element, the first substrate being provided a plurality of first internal wirings on a main surface of the first substrate on a side facing the semiconductor element, the first substrate being provided a plurality of first external wirings being electrically connected to the respective first internal wirings on a main surface of the first substrate on a side opposite to the side facing the semiconductor element, the second substrate being formed to be larger than the both main surfaces of the semiconductor element by a material having flexibility, the second substrate being provided a plurality of second internal wirings having one-end portions extended to an edge of the second substrate and some of the second internal wirings being electrically connected to at least one electrode of the semiconductor element on the main surface of the second substrate on a side on which the semiconductor element is mounted, the second substrate being provided a plurality of external terminals being electrically connected to some of the second internal wirings on at least a middle part of a main surface of the second substrate on a side opposite to the side on which the semiconductor element is mounted, and bending the respective one-end portions of the second internal wirings toward the first substrate together with the edge of the second substrate on which the second internal wirings are provided while electrically connecting the one-end portions to the first internal wirings, and integrating the semiconductor element, the first substrate, and the second substrate.

BRIEF DESCRIPTION OF THE SEVERAL VIEWS OF THE DRAWING

FIG. 15A is a diagram showing a relation between a cavity shape of an upper mold for use in the sealing step shown in FIG. 14 and a height along which a sealing member on the first substrate is provided;

FIG. 15B is a diagram showing a relation between the cavity shape of the upper mold for use in the sealing step shown in FIG. 14 and the height along which the sealing member on the first substrate is provided;

FIG. 23 is a plan view showing the semiconductor device according to a sixth embodiment seen from a second substrate side;

DETAILED DESCRIPTION OF THE INVENTION

Embodiments of the present invention will be described hereinafter with reference to the drawings.

Figure 24:
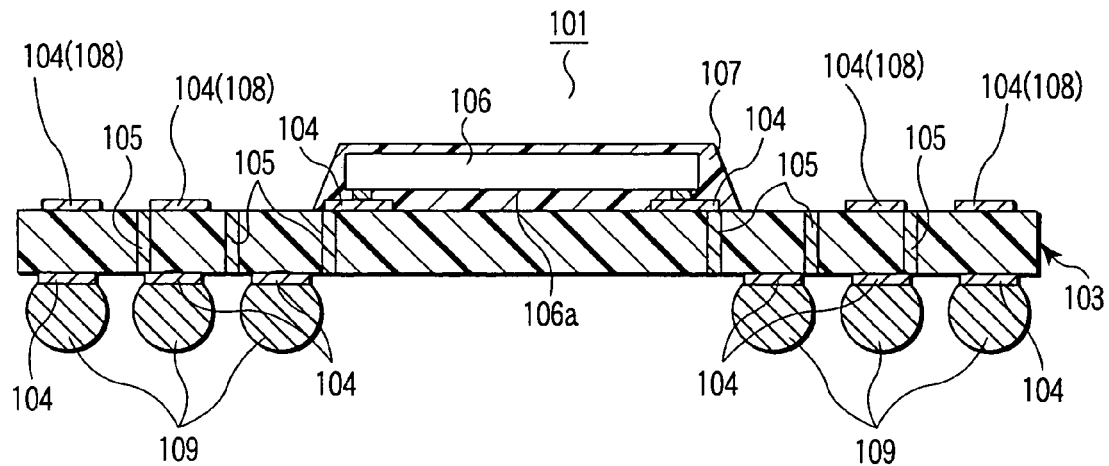
FIG. 24 is a sectional view showing the semiconductor device according to a background art which is a comparative example with respect to the first embodiment.
Figure 25:
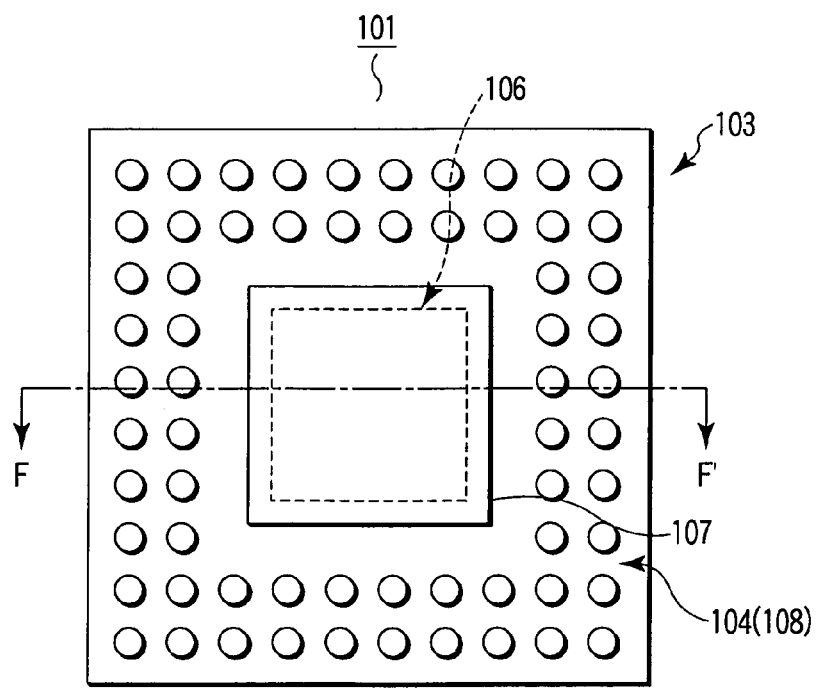
FIG. 25 is a plan view showing the semiconductor device shown in FIG. 24 seen from the main surface of the semiconductor device on which the semiconductor element is mounted.
Figure 26:
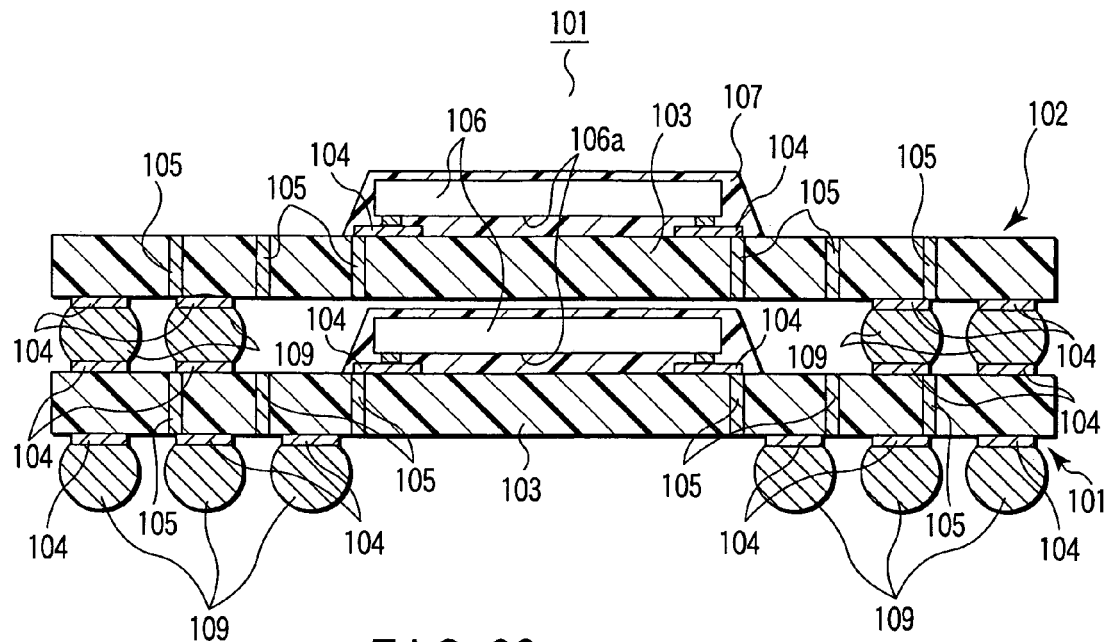
FIG. 26 is a sectional view showing a state in which another semiconductor device is mounted on the semiconductor device shown in FIG. 24.
Figure 27:
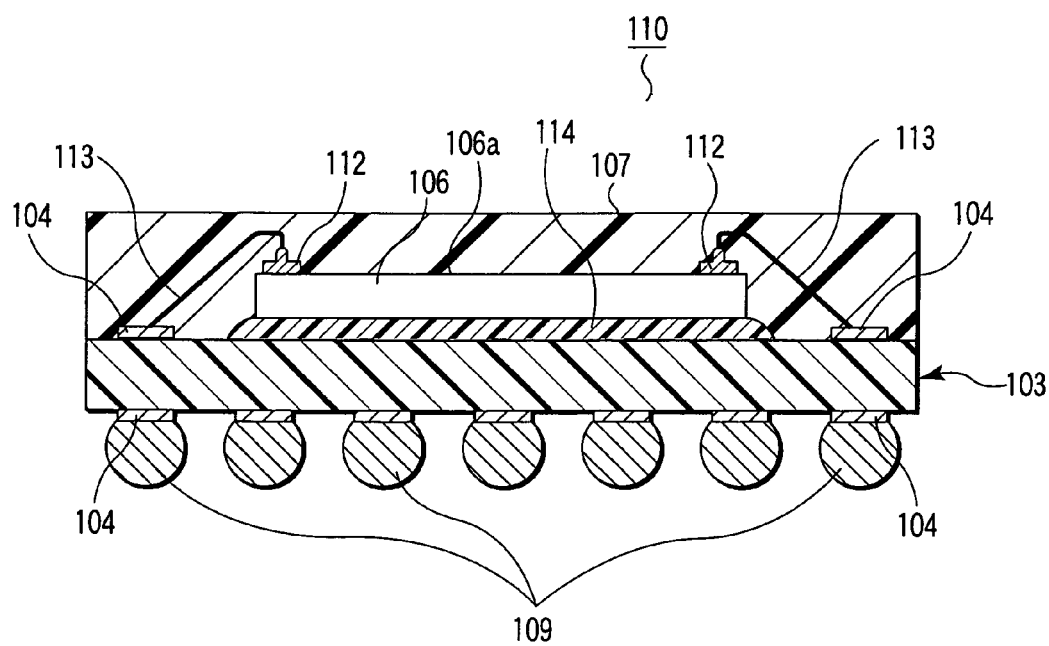
FIG. 27 is a sectional view showing a general semiconductor device for a memory according to the background art.
Figure 28:
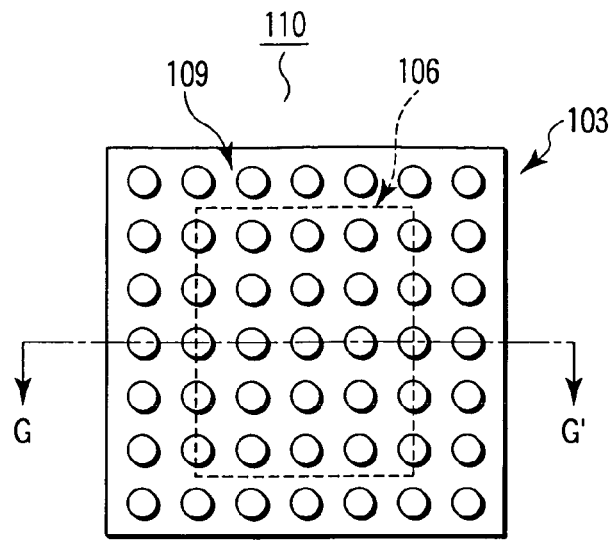
FIG. 28 is a plan view showing the semiconductor device for the memory shown in FIG. 27 seen from the main surface of the device on which an external terminal is formed.
Figure 29:
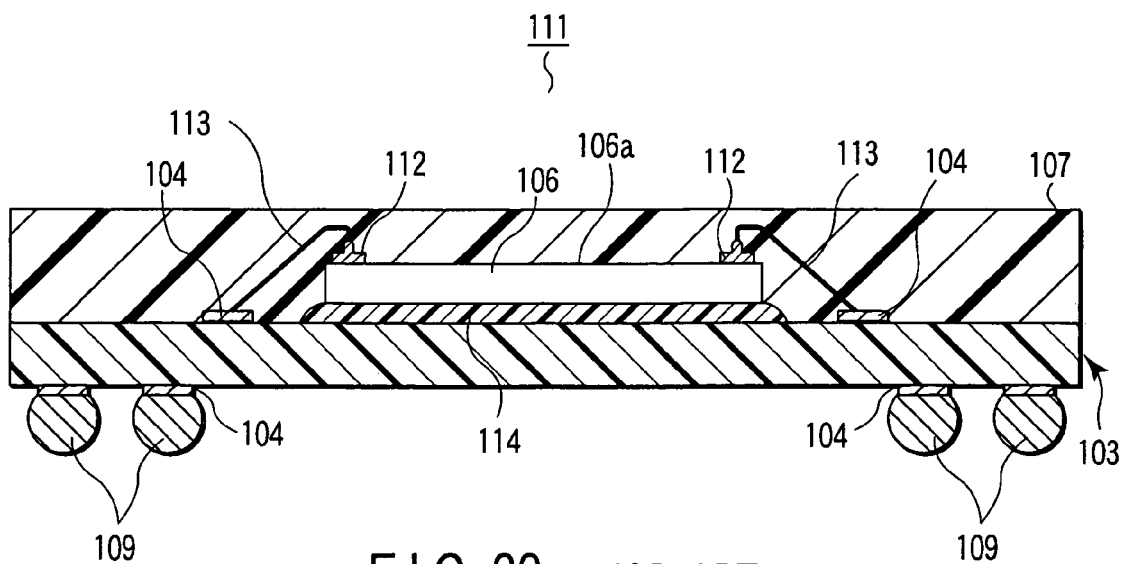
FIG. 29 is a sectional view showing the semiconductor device for the memory including the external terminal which can be mounted on the semiconductor device shown in FIG. 24.
Figure 30:
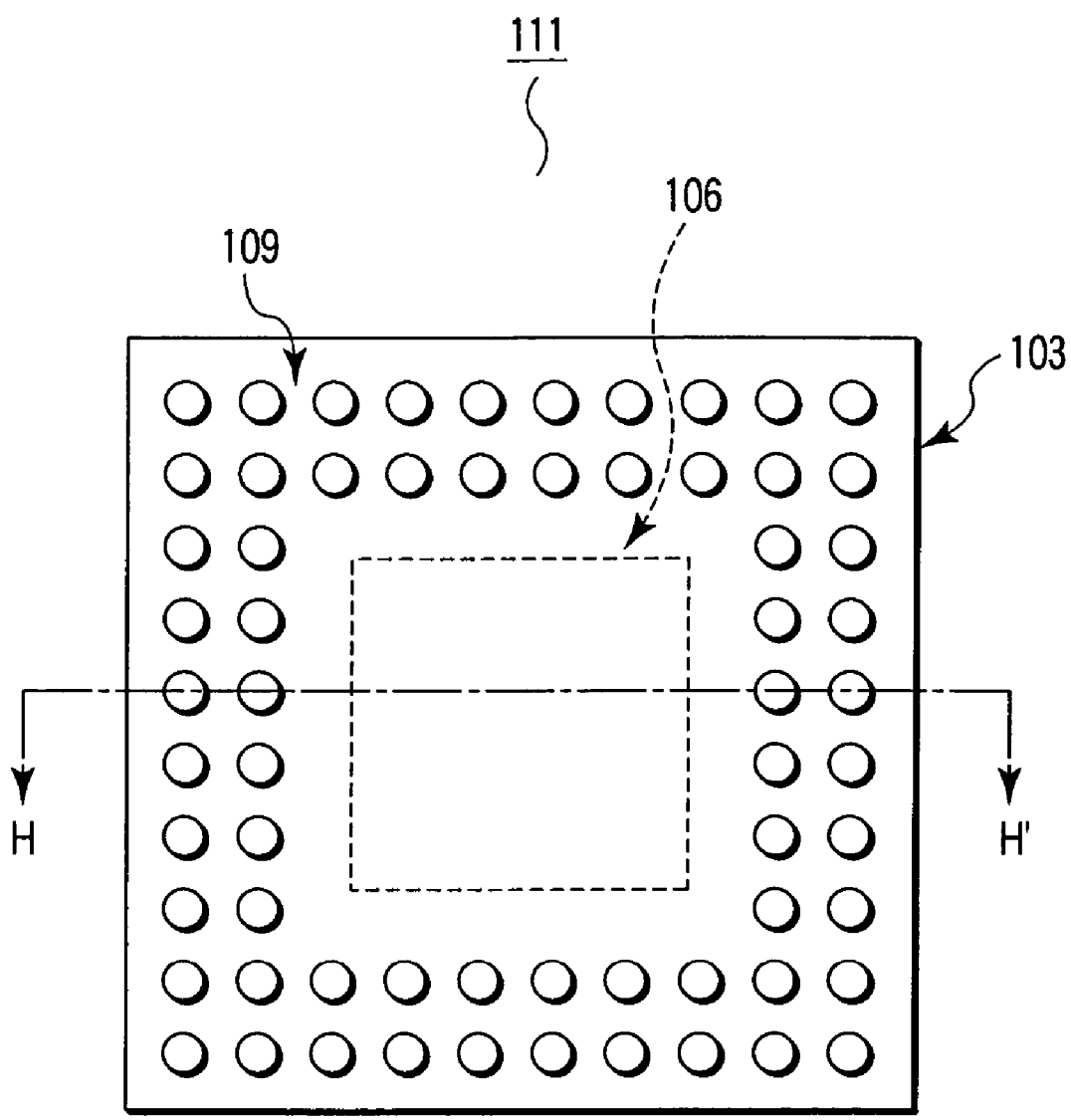
FIG. 30 is a plan view showing the semiconductor device for the memory shown in FIG. 29 seen from the main surface on which the external terminal is formed.

First, prior to the description of the respective embodiments of the present invention, a problem of the above-described background art will be concretely described in accordance with a comparative example with reference to FIGS. 24 to 30. FIG. 24 is a sectional view showing a semiconductor device according to the background art which is the comparative example with respect to a first embodiment described later. FIG. 25 is a plan view showing the semiconductor device shown in FIG. 24 seen from the main surface of the semiconductor device on which a semiconductor element is mounted. FIG. 26 is a sectional view showing a state in which another semiconductor device is mounted on the semiconductor device shown in FIG. 24. FIG. 27 is a sectional view showing a general semiconductor device for a memory. FIG. 28 is a plan view showing the semiconductor device for the memory shown in FIG. 27 seen from the main surface of the device on which an external terminal is formed. FIG. 29 is a sectional view showing the semiconductor device for the memory including the external terminal which can be mounted on the semiconductor device shown in FIG. 24. FIG. 30 is a plan view showing the semiconductor device for the memory shown in FIG. 29 seen from the main surface on which the external terminal is formed.

As described in the background art, several structures of the semiconductor devices have been proposed as a technique for mounting another semiconductor device on the upper surface of a certain semiconductor device. For example, the semiconductor device shown in FIG. 24 is assumed to be a first semiconductor device 101 including a structure on whose upper part the other semiconductor device can be mounted. FIG. 25 is a plan view showing the first semiconductor device 101 shown in FIG. 24 seen from above. It is to be noted that FIG. 24 is a sectional view along a broken line F–F' in FIG. 25. Moreover, FIG. 26 is a sectional view showing a state in which a second semiconductor device 102 is mounted as the other semiconductor device on the first semiconductor device 101 shown in FIG. 24.

As shown in FIG. 24, in the first semiconductor device 101, a plurality of wirings 104 formed of predetermined patterns are formed on lower and upper surfaces of a circuit substrate 103. It is to be noted that the respective wirings 104 of the upper and lower surfaces are connected to one another via internal wirings 105 provided along and extended through a thickness direction of the circuit substrate 103. For the first semiconductor device 101, a semiconductor element 106 is connected to the wirings 104 formed on the upper surface of the circuit substrate 103 by flip-chip connection in which an element surface 106a is directed downwards in the connection. Moreover, the semiconductor element 106 is sealed by a sealing resin 107 provided for protection of the element. Furthermore, as shown in FIGS. 24 and 25, a plurality of upper connection terminals 108 are formed by the respective wirings 104 so that the second semiconductor device 102 is connectable to the upper part of the first semiconductor device 101.

As shown in FIG. 26, the second semiconductor device 102 is connected to and mounted on the upper connection terminals 108 formed on the upper surface of the first semiconductor device 101 by solder balls 109 which are lower connection terminals formed on the lower surface of the second semiconductor device. The second semiconductor device 102 is assembled in the same manner as in the first semiconductor device 101. The first semiconductor device 101 is connected to the second semiconductor device 102, for example, as described below. First, the upper connection terminals (upper connection electrodes) 108 of the first semiconductor device 101 are coated with a flux for soldering beforehand. Next, the solder balls 109 of the second semiconductor device 102 are positioned and provided on the upper connection terminals 108 coated with the flux or the like. Subsequently, still in this state, the first and second semiconductor devices 101 and 102 are passed into a reflow furnace or the like and entirely heated. This can achieve solder connection between the upper connection terminals 108 of the first semiconductor device 101 and the solder balls 109 of the second semiconductor device 102. That is, the second semiconductor device (upper semiconductor device) 102 can be mounted on the first semiconductor device (lower semiconductor device) 101.

As described in the background art, for the first and second semiconductor devices, the semiconductor elements 106 are mounted on substantially middle parts with respect to outer configurations. Moreover, peripheries of the respective semiconductor elements 106 are sealed with the sealing resin 107. Therefore, the upper connection terminals 108 for connecting and mounting the second semiconductor device 102 onto the first semiconductor device 101 have to be disposed outside the semiconductor element 106 and sealing resin 107. Also for the second semiconductor device 102 mounted on the upper part of the first semiconductor device 101, the outer configuration and the positions of the solder balls (lower connection terminals) 109 have to be adjusted in accordance with the positions of the upper connection terminals 108.

FIG. 27 is a sectional view showing a general semiconductor memory (first semiconductor memory) 110 which is a first semiconductor device including a ball grid array (BGA) structure in a simple manner. FIG. 28 is a plan view showing the first semiconductor memory 110 shown in FIG. 27 seen from a side on which the solder balls 109 are provided. It is to be noted that FIG. 27 is a sectional view along a broken line G–G' in FIG. 28. FIG. 29 is a sectional view showing a general semiconductor memory (second semiconductor memory) 111 which is a second semiconductor device similarly including the BGA structure in the simple manner. FIG. 30 is a plan view showing the second semiconductor memory 111 shown in FIG. 29 seen from a side on which the solder balls 109 are provided. It is to be noted that FIG. 29 is a sectional view along a broken line H–H' in FIG. 30.

As shown in FIG. 27, the semiconductor element 106 is mounted on the first semiconductor memory 110 by wire bonding connection in which the semiconductor element is connected with the element surface 106a directed upwards. The first semiconductor memory 110 is electrically connected to the wirings 104 formed on the upper surface of the circuit substrate 103 via stud bumps 112 and bonding wires 113 formed on the element surface. This also applies to the semiconductor element 106 mounted on the second semiconductor memory 111 as shown in FIG. 29.

For the second semiconductor memory 111, the outer configuration and the arrangement of the solder balls 109 for external connection are changed so that the memory can be mounted on the first semiconductor memory 110. It is essentially preferable to mount the semiconductor device on which the solder balls 109 for the external connection are arranged as shown in FIG. 28 on the first semiconductor memory 110. Additionally, the upper connection terminals 108 of the first semiconductor memory 110 are arranged as shown in FIG. 25. Therefore, it is necessary to especially prepare the second semiconductor memory 111 which has the outer configuration and the arrangement of the solder balls 109 shown in FIGS. 29 and 30.

Moreover, also for the first semiconductor memory 110, the size of the semiconductor element 106 mounted on the memory, the amount of the resin 107 for sealing the semiconductor element 106 and the like differ with products. Therefore, types of second semiconductor memory 111 mounted on the upper part of the first semiconductor memory have to be increased in accordance with the types of first semiconductor memory 110. When the general-purpose semiconductor devices generally circulating in markets are combined and stacked as they are in this manner, restrictions on combinations are made. For example, when a special semiconductor device is manufactured as the upper semiconductor device in order to remove the restrictions on the combination of the semiconductor devices, a rise of manufacturing cost or a drop of production efficiency is caused.

The first embodiment of the present invention described hereinafter has been developed to solve the above-described problem. Moreover, an object of the embodiment is to provide a semiconductor device whose connecting properties with respect to another semiconductor device or electric component mounted on the upper part of the device are enhanced so that various semiconductor devices can be easily manufactured with good efficiency and at low cost, and a manufacturing method for the semiconductor device.

(First Embodiment)

Figure 1:
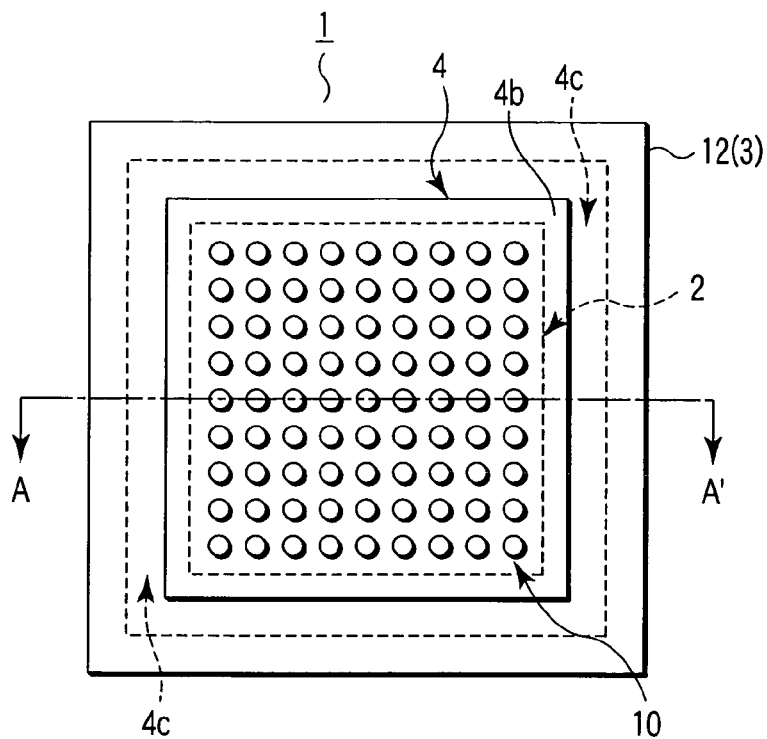
FIG. 1 is a plan view showing a semiconductor device according to a first embodiment seen from a second substrate side of the semiconductor device.
Figure 2:
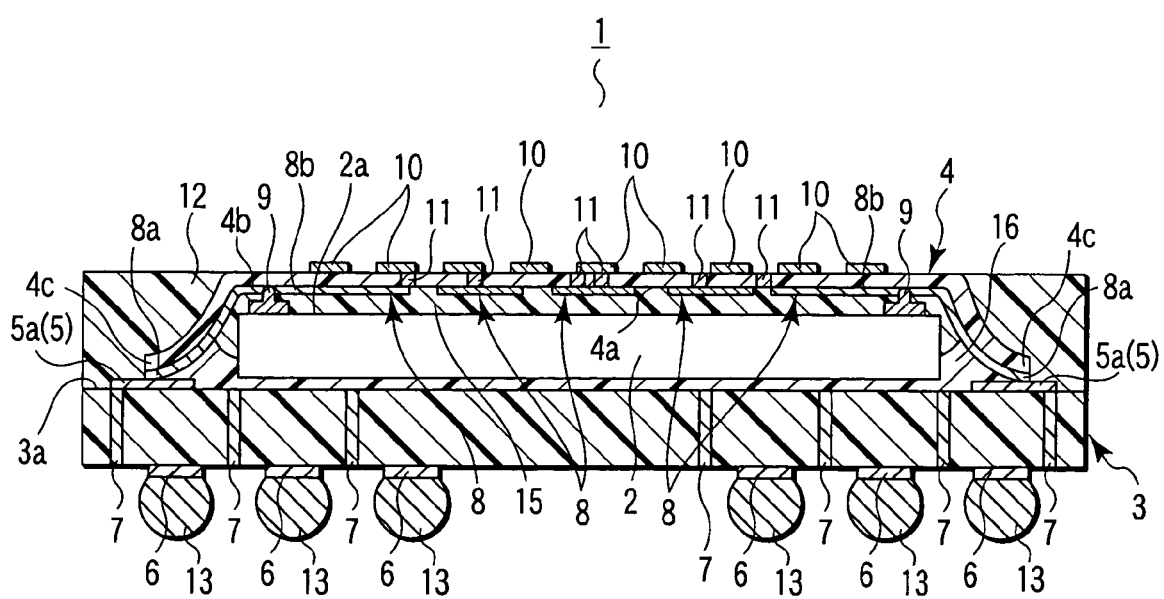
FIG. 2 is a sectional view showing the semiconductor device shown in FIG. 1 along a broken line A–A'.
Figure 3:
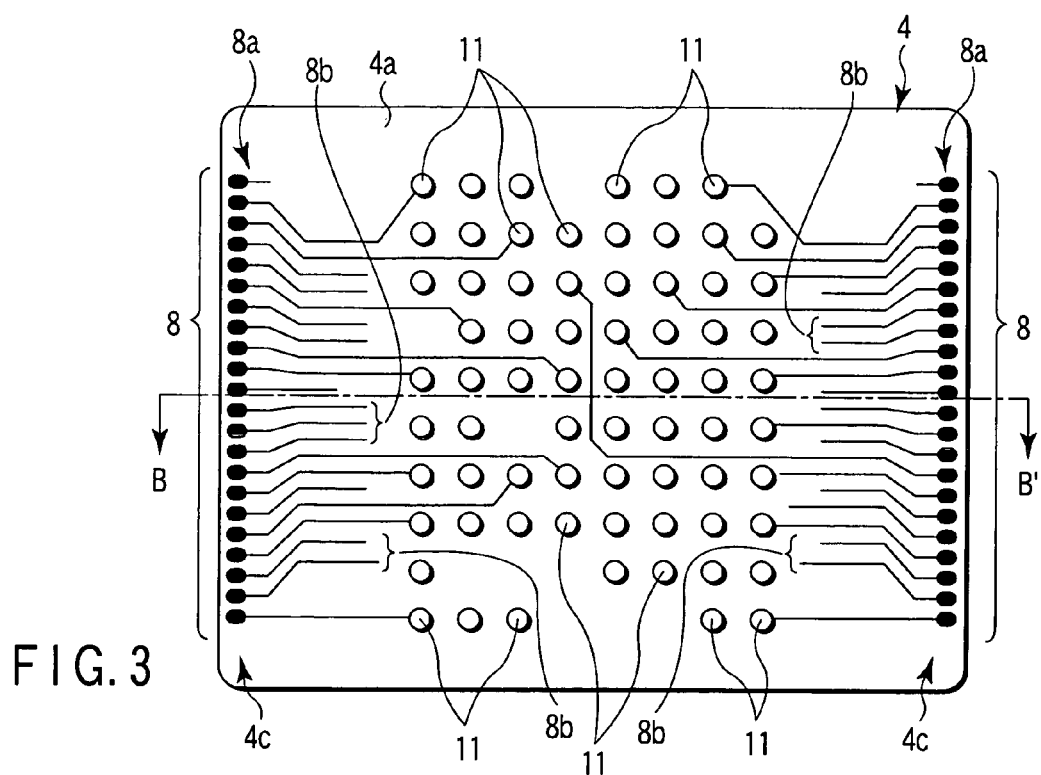
FIG. 3 is a plan view showing a second substrate provided in the semiconductor device shown in FIG. 1 seen from the main surface of the second substrate on which a semiconductor element is mounted.
Figure 4:
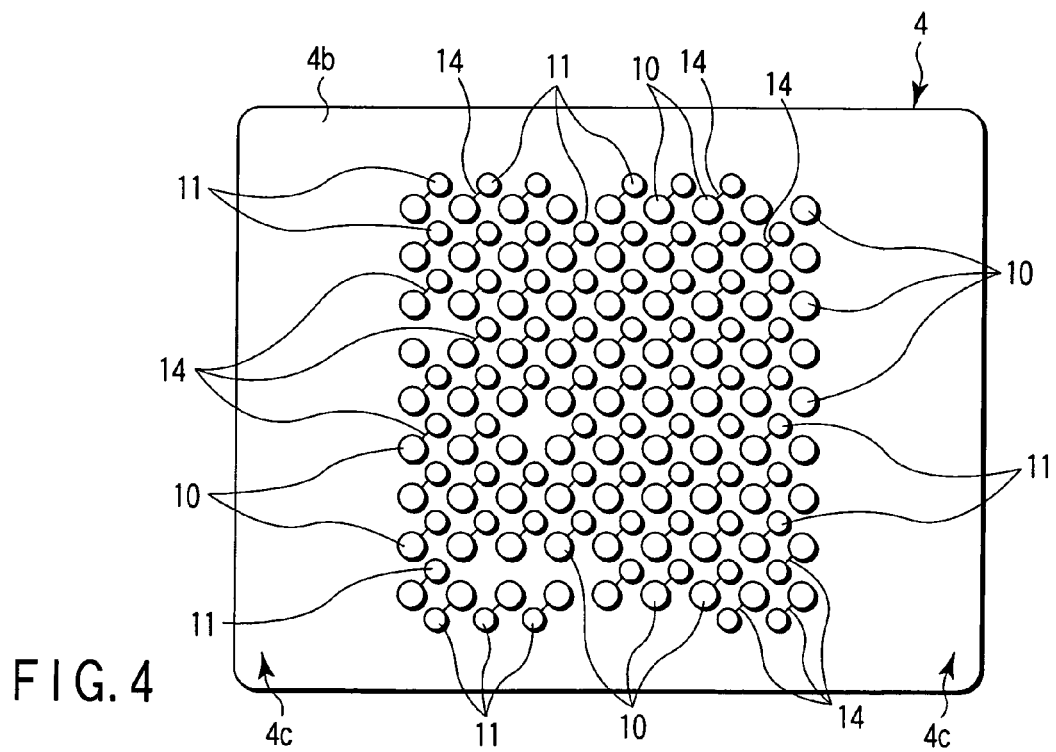
FIG. 4 is a plan view showing the second substrate provided in the semiconductor device shown in FIG. 1 seen from the main surface of the second substrate on which external terminals are formed.
Figure 5:
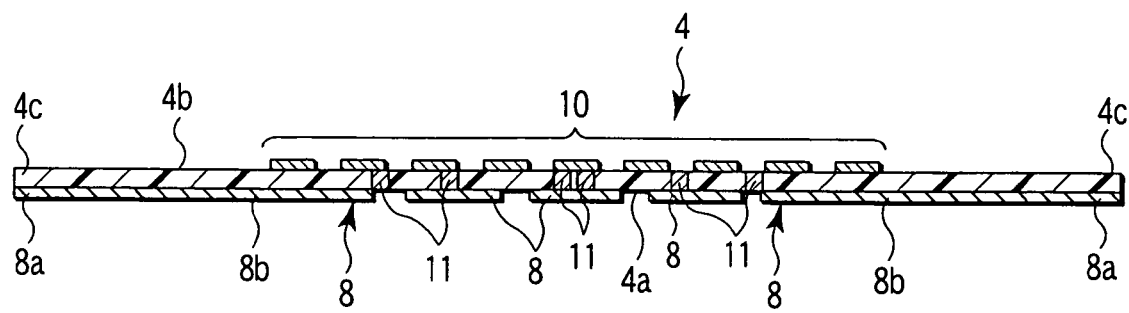
FIG. 5 is a sectional view showing the second substrate shown in FIG. 3 along a broken line B–B'.
Figure 6:
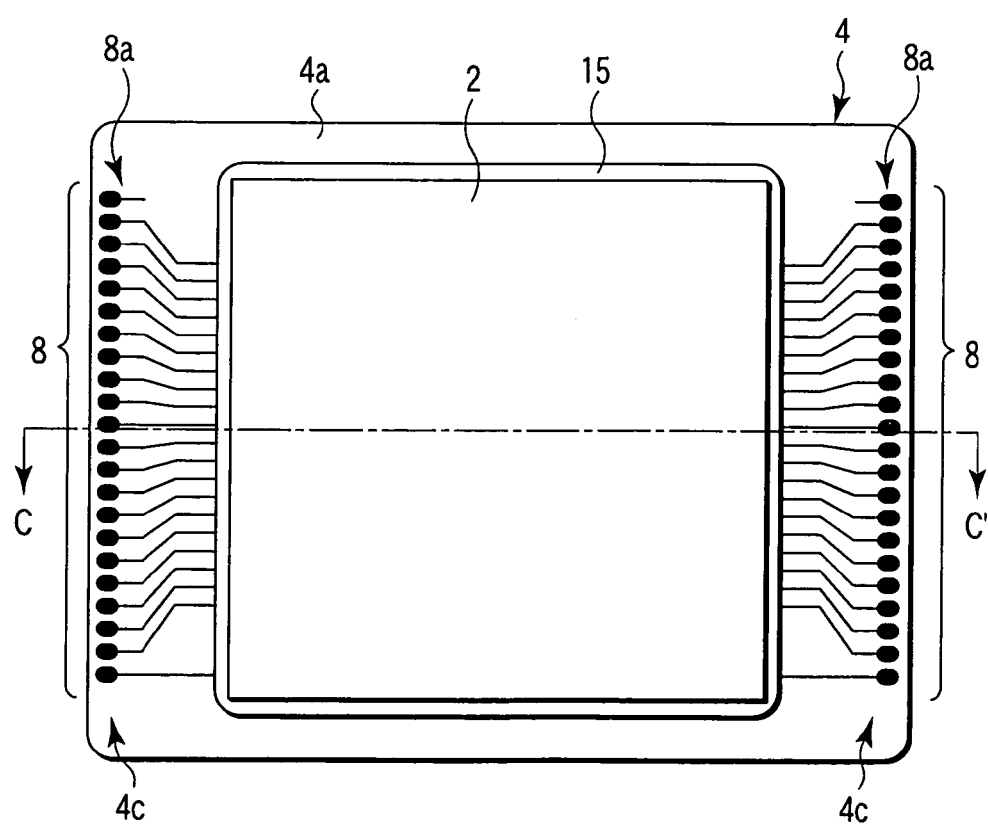
FIG. 6 is a plan view showing the second substrate on which the semiconductor element is mounted seen from the main surface of the second substrate on which the semiconductor element is mounted.
Figure 7:
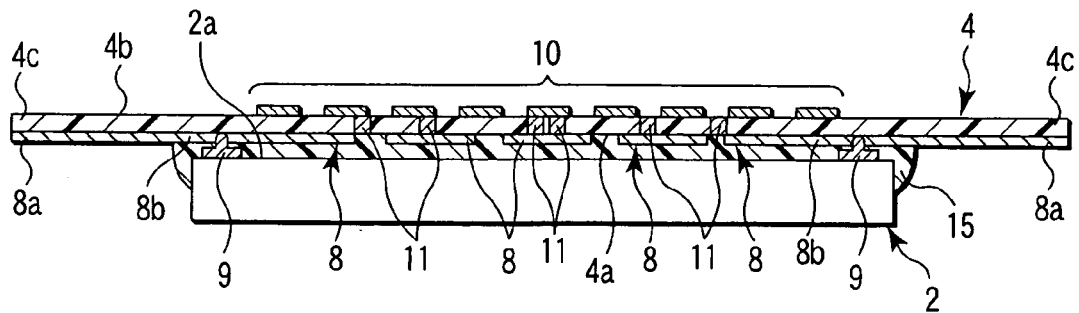
FIG. 7 is a sectional view showing the semiconductor element and the second substrate shown in FIG. 6 along a broken line C–C'.
Figure 8A:
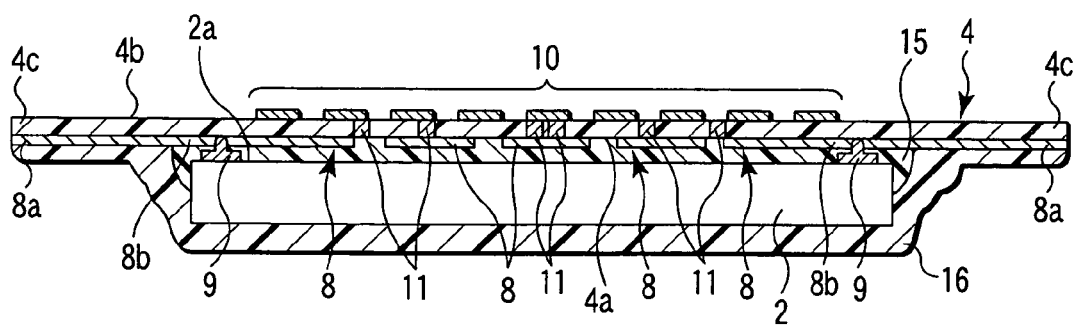
FIG. 8A is a sectional view showing one state in which an adhesive is provided on the semiconductor element and the second substrate shown in FIG. 6.
Figure 8B:
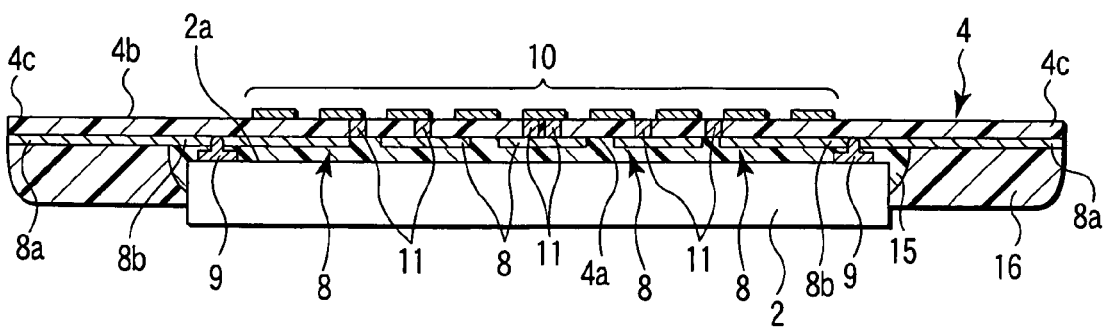
FIG. 8B is a sectional view showing another state in which the adhesive is provided on the semiconductor element and the second substrate shown in FIG. 6.
Figure 9:
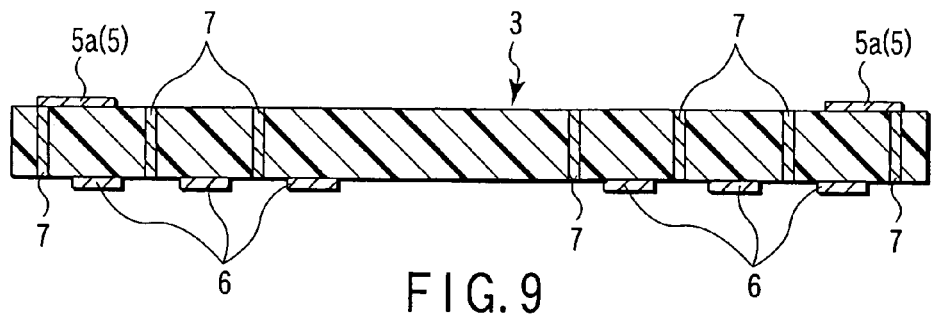
FIG. 9 is a sectional view showing a first substrate provided in the semiconductor device shown in FIG. 1.
Figure 10:
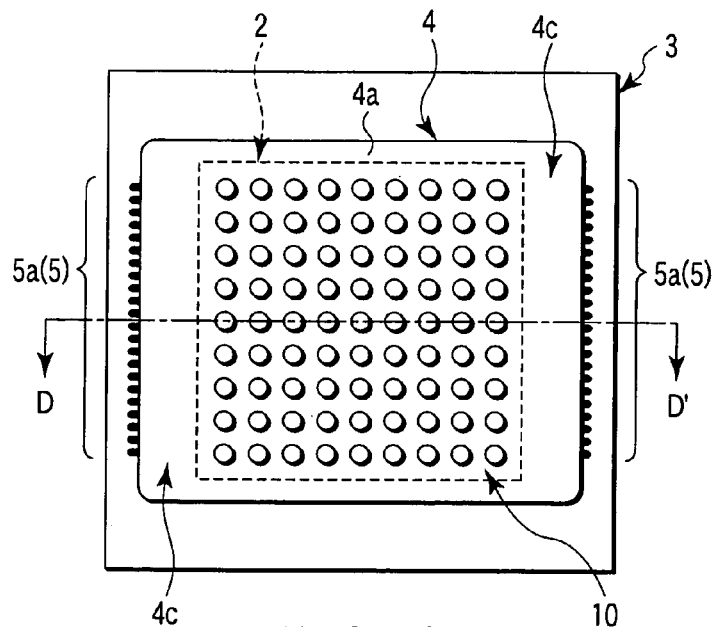
FIG. 10 is a plan view showing the first substrate attached to the second substrate on which the semiconductor element is mounted seen from the main surface of the first substrate to which the semiconductor element and second substrate are attached.
Figure 11:
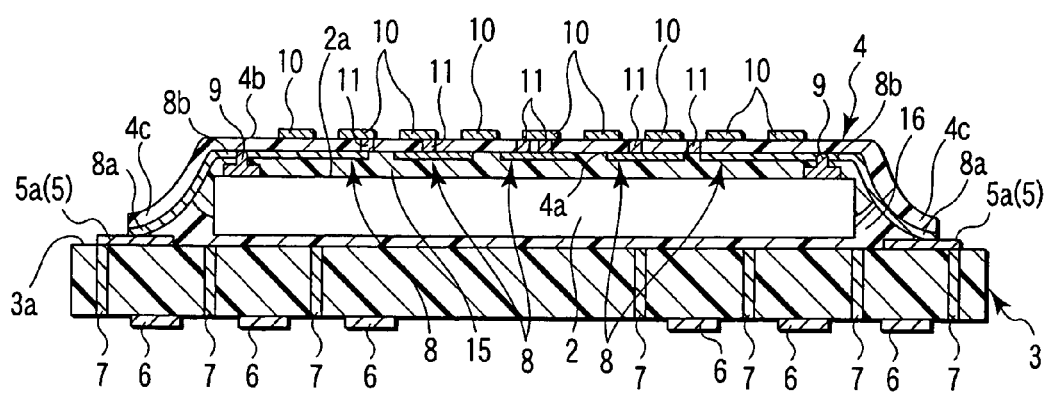
FIG. 11 is a sectional view showing the first and second substrates and the semiconductor element shown in FIG. 10 along a broken line D–D'.
Figure 12A:
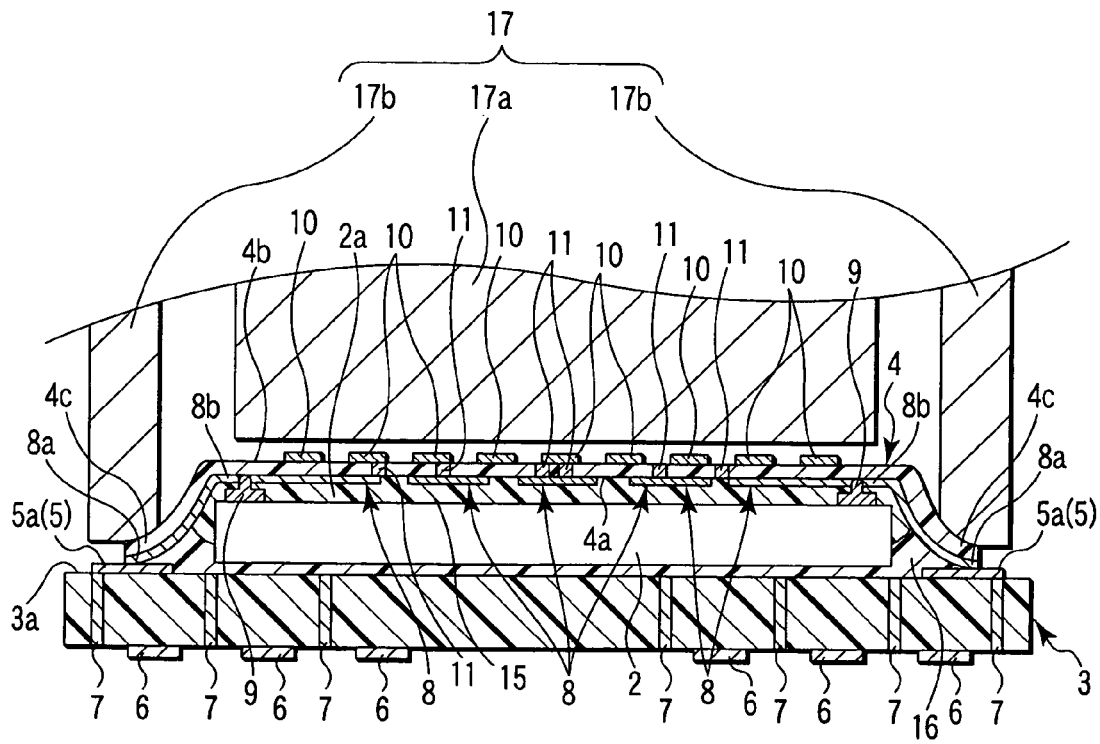
FIG. 12A is a sectional view showing one step of attaching the second substrate on which the semiconductor element is mounted to the first substrate.
Figure 12B:
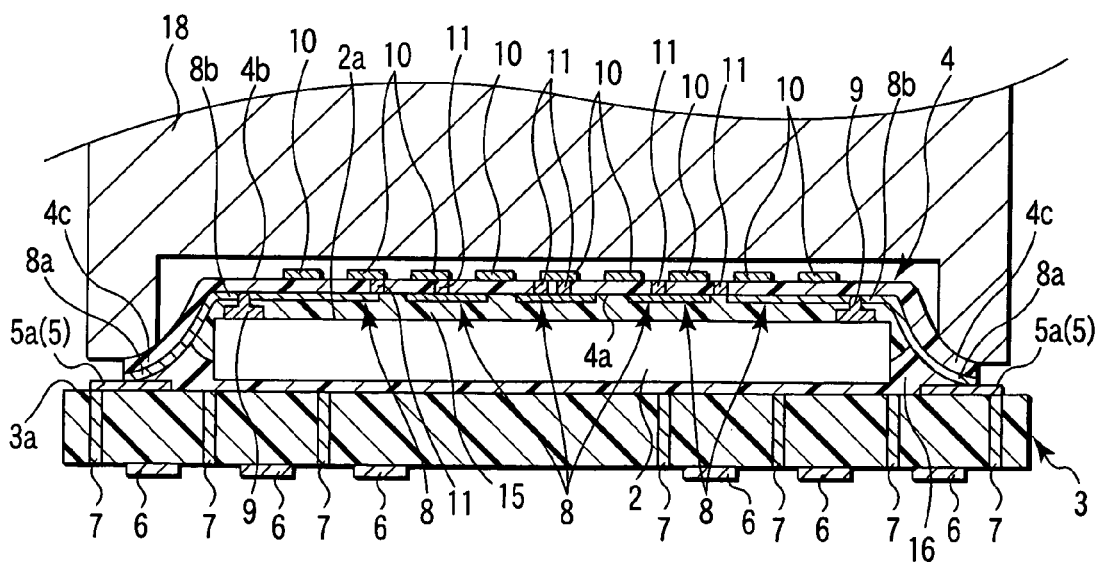
FIG. 12B is a sectional view showing another step of attaching the second substrate on which the semiconductor element is mounted to the first substrate.
Figure 13A:
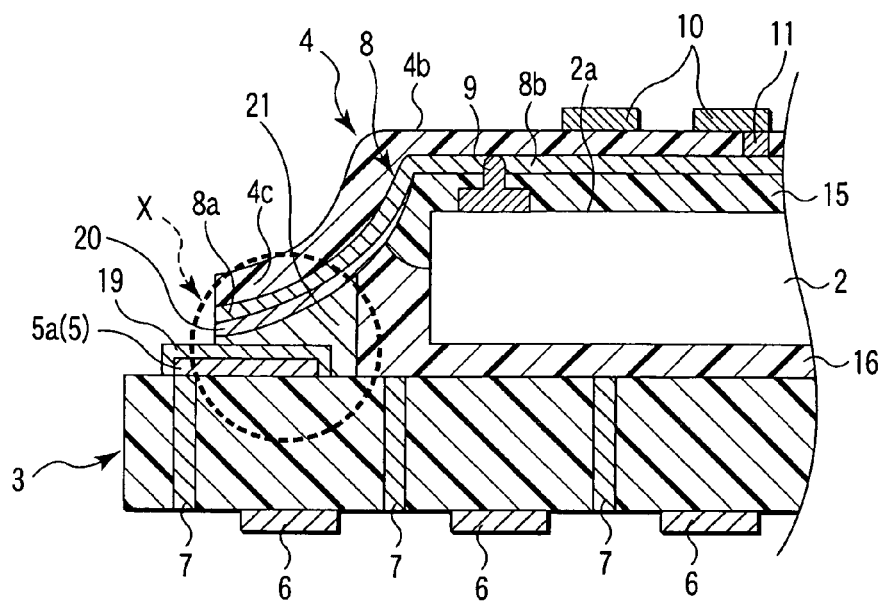
FIG. 13A is a sectional view showing a connection portion between a first internal wiring provided on the first substrate and a second internal wiring provided on the second substrate.
Figure 13B:
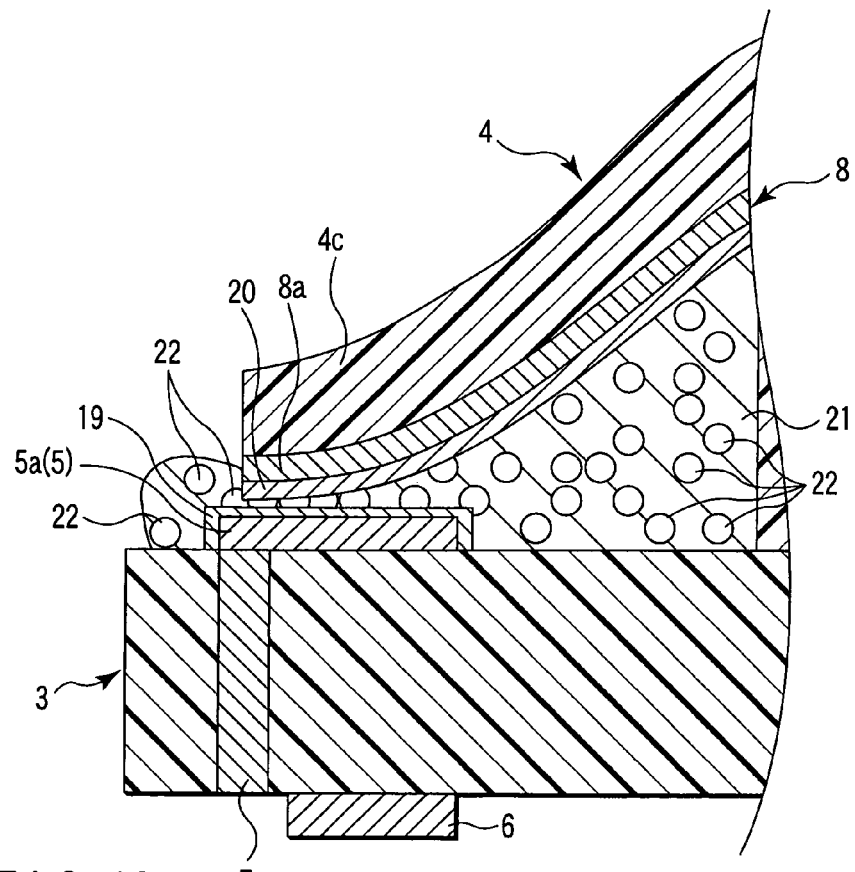
FIG. 13B is a sectional view showing the vicinity of a portion enclosed with a broken-line circle in FIG. 13A in an enlarged size.
Figure 14:
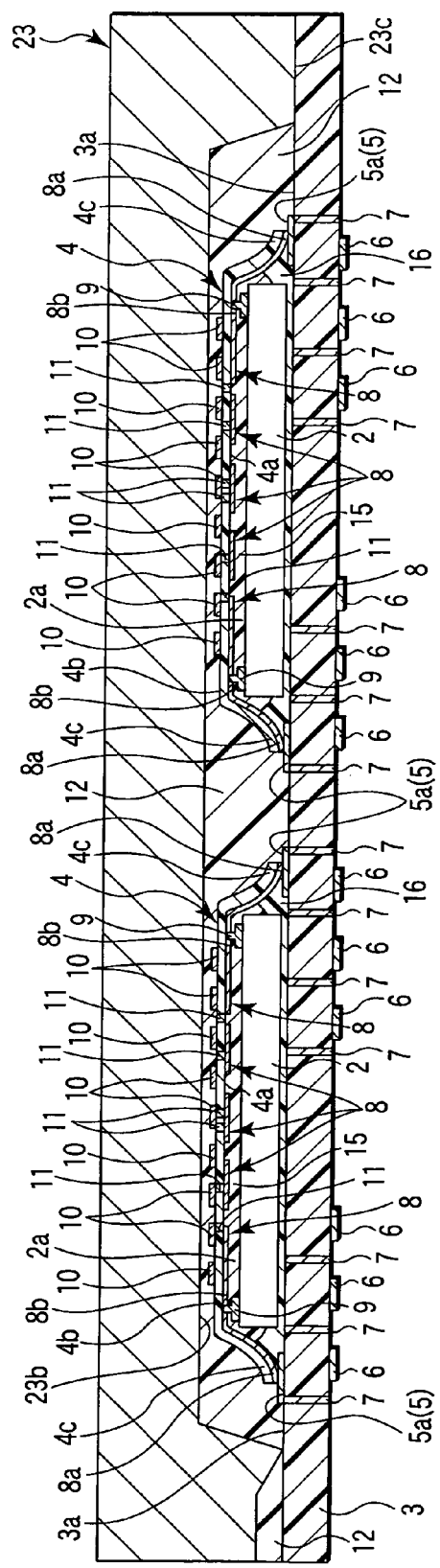
FIG. 14 is a sectional view showing a step of sealing a plurality of first substrates, second substrates, and semiconductor elements together.
Figure 16:
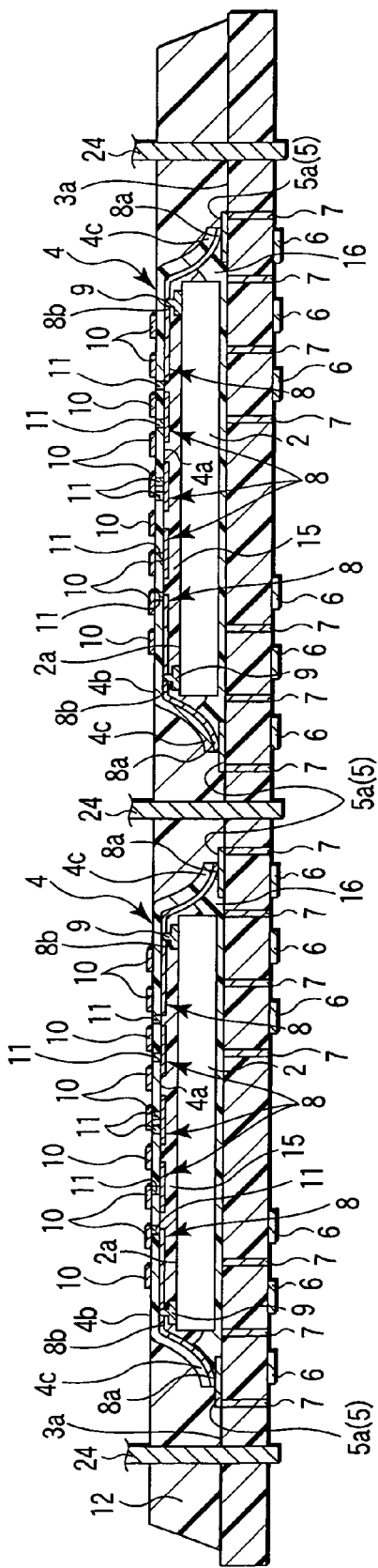
FIG. 16 is a sectional view showing a step of dividing a plurality of first substrates, second substrates, and semiconductor elements sealed together for each semiconductor device together.
Figure 17:
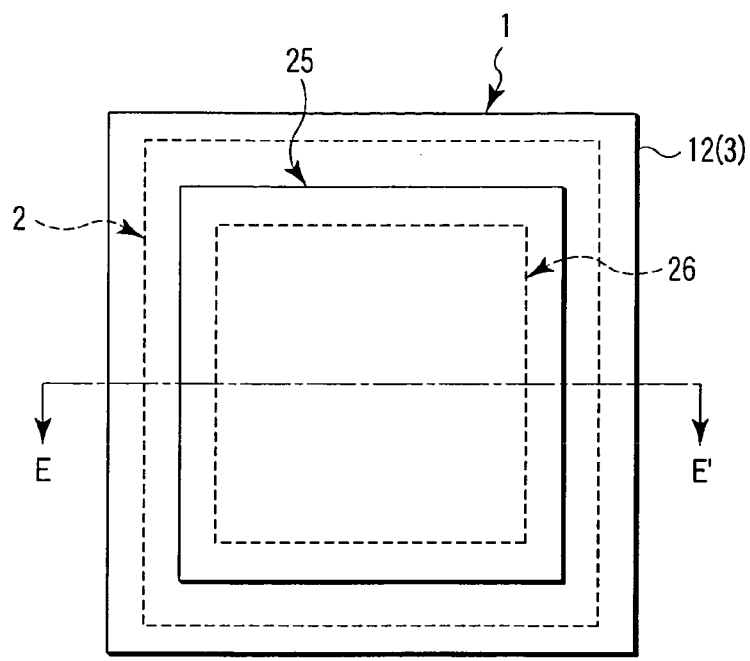
FIG. 17 is a plan view showing a state in which another semiconductor device is connected to and mounted on the semiconductor device shown in FIG. 1 as seen from above.
Figure 18:
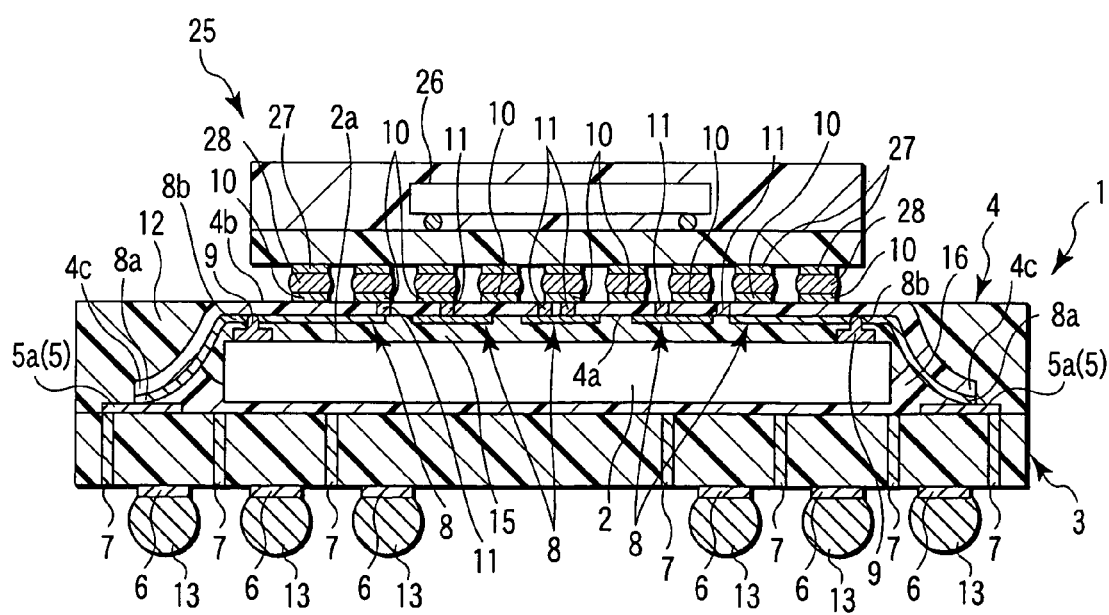
FIG. 18 is a sectional view showing two semiconductor devices shown in FIG. 17 along a broken line E–E'.

First, a first embodiment of the present invention will be described with reference to FIGS. 1 to 18. FIG. 1 is a plan view showing a semiconductor device according to the first embodiment seen from a second substrate side of the semiconductor device. FIG. 2 is a sectional view showing the semiconductor device shown in FIG. 1 along a broken line A–A'. FIG. 3 is a plan view showing a second substrate provided in the semiconductor device shown in FIG. 1 seen from the main surface of the second substrate on which a semiconductor element is mounted. FIG. 4 is a plan view showing the second substrate provided in the semiconductor device shown in FIG. 1 seen from the main surface of the second substrate on which external terminals are formed. FIG. 5 is a sectional view showing the second substrate shown in FIG. 3 along a broken line B–B'. FIG. 6 is a plan view showing the second substrate on which the semiconductor element is mounted as seen from the main surface of the second substrate on which the semiconductor element is mounted. FIG. 7 is a sectional view showing the semiconductor element and the second substrate shown in FIG. 6 along a broken line C–C'. FIGS. 8A and 8B are sectional views showing states in which an adhesive is provided on the semiconductor element and the second substrate shown in FIG. 6. FIG. 9 is a sectional view showing a first substrate provided in the semiconductor device shown in FIG. 1. FIG. 10 is a plan view showing the first substrate attached to the second substrate on which the semiconductor element is mounted as seen from the main surface of the first substrate to which the semiconductor element and second substrate are attached. FIG. 11 is a sectional view showing the first and second substrates and the semiconductor element shown in FIG. 10 along a broken line D–D'. FIGS. 12A and 12B are sectional views showing a step of attaching the second substrate on which the semiconductor element is mounted to the first substrate. FIGS. 13A and 13B are sectional views showing a connection portion between a first internal wiring provided on the first substrate and a second internal wiring provided on the second substrate. FIG. 14 is a sectional view showing a step of sealing a plurality of first substrates, second substrates, and semiconductor elements together. FIGS. 15A and 15B are diagrams showing a relation between a cavity shape of an upper mold for use in the sealing step shown in FIG. 14 and a height along which a sealing member on the first substrate is provided. FIG. 16 is a sectional view showing a step of dividing a plurality of first substrates, second substrates, and semiconductor elements sealed together for each semiconductor device together. FIG. 17 is a plan view showing a state in which another semiconductor device is connected to and mounted on the semiconductor device shown in FIG. 1 as seen from above. FIG. 18 is a sectional view showing two semiconductor devices shown in FIG. 17 along a broken line E–E'.

The semiconductor device of the present embodiment is used in a semiconductor device to whose upper surface another semiconductor device, a passive component or the like needs to be added on the assumption of a semiconductor device on which one or a plurality of semiconductor elements are mounted. Especially, the semiconductor device is used in a product requiring many variations of performance or properties of the semiconductor device. Concretely, the device includes a circuit substrate which is a base of the semiconductor device, and a film type semiconductor device constituted by flip-chip connecting the semiconductor element to a film shaped flexible substrate on whose opposite substrates circuits are formed. This film type semiconductor device is bonded to the circuit substrate in such a manner that the circuit pattern on the opposite side of the surface on which the semiconductor element is mounted is directed to the upper surface of the semiconductor device. An electrode terminal disposed on an outer peripheral portion of the film type semiconductor device is electrically connected to the electrode terminal of the circuit substrate of the base. Furthermore, the circuit pattern of the flexible substrate upper surface is exposed and sealed with the resin. This will be described hereinafter in detail.

As shown in FIGS. 1 and 2, a semiconductor device (first semiconductor device) 1 of the present embodiment includes at least one semiconductor element (semiconductor chip) 2, one first substrate 3, and one second substrate 4.

The circuit substrate 3 which is a first substrate is disposed facing one main surface of the semiconductor element (first semiconductor element) 2. Moreover, a plurality of first internal wirings 5 are provided on the main surface of the first substrate 3 on a side facing the semiconductor chip 2. Moreover, a plurality of first external wirings 6 electrically connected to the first internal wirings 5 are provided on the other main surface of the circuit substrate 3. The first internal wirings 5 are electrically connected to the first external wirings 6 in a predetermined pattern via a plurality of first plugs 7 extended through the circuit substrate 3 along the thickness direction. Moreover, solder balls 13 which are external connection terminals (lower connection terminals) are provided on the first external wirings 6.

The second substrate 4 is formed to be larger than the opposite main surfaces of the semiconductor element 2 by a material having flexibility (softness). For example, a glass epoxy substrate, polyimide substrate, BT resin substrate, PCB substrate or the like is used in the second substrate 4. Therefore, the second substrate 4 will be referred to also as the flexible substrate. The second substrate (flexible substrate) 4 is disposed so as to hold the semiconductor element 2 between the first substrate (circuit substrate) 3 and the second substrate. A plurality of second internal wirings 8 are provided on the main surface of the flexible substrate 4 facing the semiconductor element. Some of the second internal wirings 8 are electrically connected to at least one electrode 9 of the semiconductor element 2, and the semiconductor element 2 is mounted on the flexible substrate 4. A plurality of external terminals 10 electrically connected to some of the second internal wirings 8 are provided on at least a middle part of the other main surface of the flexible substrate 4. As shown in FIG. 3, one-end portions of the second internal wirings 8 are extended to edges 4c of the main surface of the flexible substrate 4 facing the semiconductor element 2. Moreover, the second internal wirings 8 are bent toward the circuit substrate (first substrate) 3 together with the edges 4c of the flexible substrate 4 on which one-end portions of the wirings are provided, and are electrically connected to the first internal wirings 5. The second internal wirings 8 are electrically connected to the external terminals 10 in the predetermined pattern via a plurality of second plugs 11 provided through the flexible substrate 4 along the thickness direction.

Moreover, in the first semiconductor device 1, at least the surface of the flexible substrate 4 except end surfaces of the external terminals 10, the semiconductor element 2, and the main surface of the circuit substrate 3 facing the semiconductor element 2 are coated with a sealing member (sealing resin) 12.

As shown in FIG. 2, the flexible substrate 4 is flip-chip connected to the semiconductor element 2 of the first semiconductor device 1. As shown in FIG. 3, a plurality of second internal wirings 8 are patterned/formed by copper wirings and the like on a chip connection surface 4a which is the main surface of the flexible substrate 4 connected to the semiconductor element 2. The one-end portions of the second internal wirings 8 are extended to the edges 4c of the chip connection surface 4a. The one-end portions constitute internal connection terminals 8a for connecting the second internal wirings 8 to the first internal wirings 5 of the circuit substrate 3 which is the base of the first semiconductor device 1. Moreover, chip connection terminals 8b for connecting the second internal wirings 8 to the semiconductor element are disposed on the chip connection surface 4a of the flexible substrate 4 in accordance with the positions of connection terminals (electrodes) 9 of the semiconductor element 2.

Moreover, as shown in FIG. 4, a plurality of external terminals (upper connection terminals) 10 for mounting a second semiconductor device 25 described later onto the first semiconductor device 1 are provided on an external connection surface 4b which is the main surface of the flexible substrate 4 on a side opposite to the chip connection surface 4a. The upper connection terminals 10 are patterned/formed by copper wirings and the like so as to be connected to some of the second internal wirings 8. Concretely, the upper connection terminals 10 are electrically connected to some of the second internal wirings 8 via a plurality of external terminal connection wirings 14 and the through plugs 11 described later, which are formed on the external connection surface 4b. It is to be noted that the external terminal connection wirings 14 and through plugs 11 are omitted from FIG. 1 described above and FIGS. 10 and 23 described later so that the figures are easily referred to.

As shown in FIG. 5, the plurality of upper connection terminals 10 or second internal wirings 8 are patterned/formed in the predetermined pattern by the copper wirings on the opposite main surfaces 4a, 4b of the flexible substrate 4. These upper connection terminals 10 are connected to some of the second internal wirings 8 via the external terminal connection wirings 14 and the through plugs (via plugs) 11 which are second plugs formed in through holes (internal via holes: IVH) extended through the flexible substrate 4 along the thickness direction. When the upper connection terminals 10 are connected to the second internal wirings 8, for example, the following two wirings are possible. One of them is a wiring for electrically connecting the second semiconductor device 25 (second semiconductor element 26) mounted on the upper part of the first semiconductor device 1 to the circuit substrate of a system (not shown) via the circuit substrate 3 which is the base of the first semiconductor device 1. Accordingly, a signal output from the second semiconductor device 25 can be sent to an external system. The other is a wiring for directly and electrically connecting the second semiconductor device 25 mounted on the upper part of the first semiconductor device 1 to the semiconductor element 2 of the first semiconductor device 1. Especially in a constitution in which the second semiconductor device 25 is mounted for the purpose of assisting the function of the first semiconductor device 1, the flexible substrate 4 has a structure including a large number of wirings which directly connect the first semiconductor device 1 to the second semiconductor device 25.

The first semiconductor device 1 and the manufacturing method for the device of the present embodiment will be described hereinafter along an order of the manufacturing process.

As shown in FIGS. 6 and 7, the first semiconductor element 2 provided in the first semiconductor device 1 is electrically connected and mounted onto the flexible substrate 4. In more detail, the first semiconductor element 2 is flip-chip connected to the chip connection surface 4a with a posture of the element surface 2a, as the main surface on which the element is formed, facing the chip connection surface 4a of the flexible substrate 4. Prior to the connection, as shown in FIGS. 2 and 7, the electrodes 9 of the first semiconductor element 2 is formed in a protrusion shape on the element surface 2a. Concretely, the electrodes 9 are formed as convex-shaped Au stud bumps 9 by use of a tool and method for forming general Au bonding wires (not shown). Additionally, the electrodes 9 may also be formed as convex shaped plated electrodes subjected to a plating treatment using Au. Alternatively, the electrodes 9 may also be formed as the convex-shaped soldered electrodes subjected to a coating treatment by the soldering. Moreover, the respective second internal wirings 8 of the flexible substrate 4 and the electrodes 9 of the first semiconductor element 2 are subjected to heating, press-binding, heating reflow or the like to electrically connect the second internal wirings 8 to the electrodes 9. Furthermore, as described later, a thermosetting resin 15, an anisotropic conductive sheet 21 and the like are provided between the flexible substrate 4 and the first semiconductor element 2 to electrically connect the second internal wirings 8 to electrodes 9.

As shown in FIGS. 8A and 8B, an adhering resin (adhesive) 16 is provided around the first semiconductor element 2 connected to (mounted on) the flexible substrate 4. A method of providing the adhesive 16 is roughly divided into the following two cases. In one case, as shown in FIG. 8A, the adhering resin 16 is attached to the whole chip connection surface 4a of the flexible substrate 4 on which the first semiconductor element 2 is mounted. In the other case, as shown in FIG. 8B, the adhering resin 16 is attached to only the vicinity of the internal connection terminals (electrode terminals) 8a of the second internal wirings 8 connected to the first internal wirings 5 of the circuit substrate 3. Both FIGS. 8A and 8B show a state in which the adhesive 16 is attached to the flexible substrate 4 and first semiconductor element 2 shown in FIG. 6. In this case, as the adhering resin 16, a sheet or liquid material is preferably used which can be hardened by heating or the like to fix the first semiconductor element 2 to the flexible substrate 4.

As shown in FIG. 9, in the circuit substrate 3, the first internal wirings 5 provided on the main surface are connected to the first external wirings 6 provided on the other main surface via the first plugs (through plugs, via plugs) 7 formed through the circuit substrate 3 along the thickness direction. Accordingly, the electric signal received from the internal connection terminals (electrode terminals) 8a of the second internal wirings 8 of the flexible substrate 4 can be sent to the outside from the lower side (lower surface) of the first semiconductor device 1 (circuit substrate 3).

As shown in FIGS. 10 and 11, the flexible substrate 4 on which the first semiconductor element 2 is mounted is mounted on the circuit substrate 3. The flexible substrate 4 is positioned so as to align the positions of the internal connection terminals 8a of the second internal wirings 8 with those of internal connection terminals (electrodes) 5a of the first internal wirings 5 of the circuit substrate 3, and is disposed to face the circuit substrate 3. Thereafter, the second internal wirings 8 are bent toward the circuit substrate 3 together with the edges 4c of the flexible substrate 4 on which the internal connection terminals 8a are provided until the internal connection terminals 8a of the second internal wirings 8 contact the electrodes 5a of the first internal wirings 5. Moreover, in a state in which the internal connection terminals 8a of the second internal wirings 8 contact the electrodes 5a of the first internal wirings 5, contact portions are subjected to a predetermined connection treatment. Accordingly, the internal connection terminals 8a of the second internal wirings 8 are electrically connected to the electrodes 5a of the first internal wirings 5. It is to be noted that the surfaces of the internal connection terminals 8a of the second internal wirings 8 and the electrodes 5a of the first internal wirings 5 are preferably subjected to a plating treatment, a printing or coating treatment of a solder material and the like prior to the connection treatment so as to facilitate the connection treatment.

FIGS. 12A and 12B show a method of mounting (bonding, connecting) the flexible substrate 4 on which the first semiconductor element 2 is mounted to the circuit substrate 3. To mount the flexible substrate 4 and first semiconductor element 2 onto the circuit substrate 3, a mounting tool 17 shown in FIG. 12A or a mounting tool 18 shown in FIG. 12B is used. Accordingly, the flexible substrate 4 is fixed to the circuit substrate 3, and further the internal connection terminals 8a of the second internal wirings 8 are also connected to the electrodes 5a of the first internal wirings 5. For the mounting tool 17 shown in FIG. 12A, a pressurizing portion 17a is constituted as a component separate from bonding portions 17b. The pressurizing portion 17a presses and bonds the flexible substrate 4 on which the first semiconductor element 2 is mounted onto the circuit substrate 3 which is the base. The bonding portions 17b electrically bonds the internal connection terminals 8a of the second internal wirings 8 formed on the edges 4c of the flexible substrate 4 to the electrodes 5a of the first internal wirings 5 formed on the edges of the circuit substrate 3 which is the base. On the contrary, for the mounting tool 18 shown in FIG. 12B, the pressurizing portion is constituted integrally with the bonding portions.

With either of the mounting tools 17, 18, the bonding and the electric connecting of the flexible substrate 4 onto the circuit substrate 3 which is the base can easily be performed together. When these mounting tools 17, 18 are used to mount the flexible substrate 4 onto the circuit substrate 3, the first semiconductor element 2 is electrically connected to the first external wirings 6 (lower connection terminals, solder balls 13) provided on the lower surface (lower part) of the first semiconductor device 1. Additionally, the first semiconductor element 2 is also electrically connected to the upper connection terminals 10 provided on the upper surface (upper part) of the first semiconductor device 1.

FIGS. 13A and 13B show a connection portion between the internal connection terminals 8a of the second internal wirings 8 formed on the edges 4c of the flexible substrate 4 and the electrodes 5a of the first internal wirings 5 formed on the edges of the circuit substrate 3 in an enlarged size. FIG. 13B is a sectional view showing a portion X enclosed by a broken-line circle in FIG. 13A in a further enlarged size. As shown in FIGS. 13A and 13B, in the present embodiment, Au plating portions 19, 20 are provided on the surface of a connection portion (connection terminal) 5a of each first internal wiring 5 and the surface of the connection portion (connection terminal) 8a of each second internal wiring 8. Moreover, an anisotropic conductive sheet 21 is held as a conductive member between the Au plating portion 19 of each first internal wiring 5 and the Au plating portion 20 of each second internal wiring 8. The first internal wirings 5 are electrically connected to the second internal wirings 8 via the Au plating portions 19, 20 and anisotropic conductive sheet 21. The anisotropic conductive sheet 21 also functions as the adhesive between the circuit substrate 3 and the flexible substrate. The anisotropic conductive sheet 21 includes a plurality of anisotropic conductive particles 22. For example, Ni particles, plastic balls on whose surface the Au plating portion is provided or the like are used as the anisotropic conductive particles 22. By these steps, the first semiconductor element 2, circuit substrate 3, and flexible substrate 4 are electrically connected to one another and integrated.

It is to be noted that in FIGS. 2, 3, 5 to 8B, 10 to 12B described above, and FIGS. 14 to 16, 21, 22 described later, for ease of seeing the figures, structures in the vicinity of the internal connection terminals 8a of the second internal wirings 8 and the electrodes 5a of the first internal wirings 5 are simplified and shown.

Next, as shown in FIG. 14, a plurality of first semiconductor devices 1 constituted by integrating the first semiconductor element 2, circuit substrate 3, and flexible substrate 4 are sealed with the resin together by a molding method. In the above description, to simply and easily understand the content, the first semiconductor device 1 has been simplified and described as a single semiconductor device. However, in an actual manufacturing process, as shown in FIG. 14, a plurality of first semiconductor devices 1 are manufactured together. In the present embodiment, the circuit substrate 3 connected to one or a plurality of flexible substrates 4 on which the first semiconductor elements 2 are mounted is sealed by the sealing resin 12 only on a side facing the first semiconductor element 2. That is, the first semiconductor device 1 is formed by a so-called single-surface molding method.

In the present embodiment, as shown in FIG. 2, the surface (external connection surface) 4b of a region of the flexible substrate 4 on which the upper connection terminals 10 are provided, the first semiconductor element 2, and an exposed surface 3c of the circuit substrate 3 outside the flexible substrate 4 in the main surface facing the flexible substrate 4 are coated with the sealing resin 12. At this time, as shown in FIG. 2, at least end surfaces 10a of the upper connection terminals 10 are exposed from the sealing resin 12 even after sealed. To expose the upper connection terminals 10 from the surface of the sealing resin 12 (the upper surface of the first semiconductor device 1), a relation is important between the shape and dimension of an upper mold 23 of a mold for the molding/sealing and a height to the external connection surface 4b of the flexible substrate 4 from the main surface of the circuit substrate 3 facing the first semiconductor element 2. The relation will be described hereinafter with reference to FIGS. 15A and 15B.

It is necessary to seal the device in an appropriate resin thickness in order to expose the electrode connection surfaces 10a for connecting the upper part of the device to another semiconductor device (end surfaces of the upper connection terminals 10) onto the upper surface of the first semiconductor device 1 after sealed. Here, an appropriate thickness (height) of the sealing resin 12 after the sealing is assumed as T. As shown in FIG. 15A, the appropriate thickness T of the sealing resin 12 after the sealing is substantially equal to the height to the external connection surface 4b of the flexible substrate 4 from the main surface of the circuit substrate 3 facing the first semiconductor element 2. Moreover, as shown in FIG. 15B, the thickness (dimension) T is determined by a dimension S of a cavity portion 23a of the upper mold 23 for the molding. The dimension S of the cavity portion 23a indicates the height (depth) to a surface 23b of the upper mold for the molding 23 facing the external connection surface 4b of the flexible substrate 4 from a surface 23c of the upper mold for the molding 23 facing the exposed surface 3a of the circuit substrate 3. In accordance with experiments conducted by the present inventors, it is seen that in the present embodiment, when the dimension S is set to a range of about −150 µm to +150 µm with respect to the dimension T, the external connection surface 4b of the flexible substrate 4 can be exposed from the molding resin 12.

It is to be noted that, needless to say, it is necessary to form the upper connection terminals 10 by materials having a high resistance to various physical or chemical external actions such as pressure and heat from the outside. For example, the upper connection terminals 10 need to be formed by materials having no possibility that the terminals are deteriorated by the pressure, heat and the like in a molding/sealing step. Moreover, the upper connection terminals 10 are preferably formed by a material which is not easily oxidized even by the exposure to the atmosphere after the first semiconductor device 1 is completed.

Moreover, the thickness T of the sealing resin 12 changes with the material, property, type, and amount of the resin, the applied temperature, pressure and the like. Additionally, the thickness T of the sealing resin 12 also changes with the thickness, size, shape, material, number, arrangement state and the like of the first semiconductor element 2, the circuit substrate 3 which is the base, the flexible substrate 4, and the upper connection terminals 10. Therefore, the dimension S of the cavity portion 23a of the upper mold 23 with respect to the thickness T of the sealing resin 12 needs to be set to an appropriate size in accordance with each factor. That is, the appropriate range of the dimension S of the cavity portion 23a of the upper mold 23 is not necessarily limited to about ±150 µm or less with respect to the thickness T of the sealing resin 12. Not only the dimension S of the cavity portion 23a but also the shape and dimension of the upper mold for the molding 23 are appropriately set in accordance with the respective factors in order to provide the sealing resin 12 in such a manner that at least the end surfaces 10a of the upper connection terminals 10 are exposed from the sealing resin 12 even after the sealing.

In this manner, in the present embodiment, the upper mold for the molding 23 formed in such a manner that the sealing resin 12 can be provided while exposing at least the end surfaces 10a of the upper connection terminals 10 after the sealing is used. Moreover, the surface 23b of the upper mold 23 facing the surface 4b of the region of the flexible substrate 4 on which the upper connection terminals 10 are provided is positioned in such a manner that an amount of sealing resin 12 capable of exposing at least the end surfaces 10a of the upper connection terminals 10 after the sealing can be provided. Thereafter, the sealing resin 12 is injected between the surface 4b of the region of the flexible substrate 4 on which the upper connection terminals 10 are provided and the facing surface 23b of the upper mold 23 facing the surface 4b.

Next, as shown in FIG. 16, a plurality of first semiconductor devices 1 sealed with the resin is cut/separated for each device using cutting tool (blades) 24.

Next, as shown in FIG. 2, the solder balls 13 are attached to the first external wirings 6 (lower connection terminals) of each separated first semiconductor device 1. In these steps, the desired first semiconductor device 1 can be obtained as shown in FIG. 2. That is, a plurality of upper connection terminals 10 are provided on at least an upper surface middle part of the first semiconductor device 1 on which at least one semiconductor element 2 is mounted. It is possible to obtain the first semiconductor device 1 on which the other semiconductor device or passive component can easily be combined and mounted regardless of the type.

For example, as shown in FIGS. 17 and 18, the second semiconductor device 25 manufactured based on general-purpose specifications can be mounted on the first semiconductor device 1 via the upper connection terminals 10. For example, the second semiconductor element 26 is mounted on the second semiconductor device 25. Some of the electrodes (terminals) (not shown) of the second semiconductor element 26 are electrically connected to the electrodes of the first semiconductor element 2 via a plurality of lower connection terminals 27, solder balls 28, and the upper connection terminals 10 of the first semiconductor device 1 which are external connection terminals. Some of the electrodes of the second semiconductor element 26 are not electrically connected to the electrodes of the first semiconductor element 2, and are electrically connected to another electric circuit via the lower connection terminals 27, solder balls 28, upper connection terminals 10, lower connection terminals 6, solder balls 13 and the like.

As described above, in accordance with the first embodiment, the first semiconductor device 1 whose connection property to the other semiconductor device or electric component mounted on the upper part of the device is enhanced can be efficiently and easily manufactured at a low cost. Additionally, various lamination type semiconductor devices constituted by mounting the other electric components on the upper part of the first semiconductor device 1 can easily be manufactured with good efficiency and at low cost. Concretely, a plurality of upper connection terminals 10 capable of electrically connecting and mounting the second semiconductor device 25 or the passive component onto the upper part of the first semiconductor device 1 are provided on at least the upper surface middle part of the first semiconductor device 1. Accordingly, it is possible to easily mount various components having functions to be added onto the first semiconductor device 1 which is the base. Especially for a microprocessor (CPU) constituted as the base which is the first semiconductor device 1, many product lineups are required so that a memory capacity and analog component to be added differ in accordance with an apparatus for which the product is used. In this case, it is possible to easily mount general-purpose electronic components generally circulating in the market, such as the memory and DSP, using a plurality of upper connection terminals 10 provided on the upper surface middle part of the first semiconductor device 1 which is the base. That is, it is possible to easily manufacture an inexpensive mixed/loaded type semiconductor device without especially manufacturing new devices or components in accordance with purposes or applications.

Moreover, the connecting (bonding) of the second internal wirings 8 formed on the flexible substrate 4 to the first internal wirings 5 formed on the circuit substrate 3 is achieved by bending the second internal wirings 8 together with the edges 4c of the flexible substrate 4. In accordance with the method, shocks at a connection time of the respective internal wirings 5, 8 can be absorbed by the flexible substrate 4 formed of the material having softness to safely and smoothly connect the internal wirings 5 to the internal wirings 8 in a more stable state. That is, the first semiconductor device 1 whose mounting ability is enhanced can easily be manufactured, and further production efficiency can be enhanced. Moreover, since the semiconductor element 2 is covered by not only the sealing resin 12 but also the flexible substrate 4, a protection capability of the semiconductor element 2 is further enhanced. As a result, reliability, durability, and quality of the first semiconductor device 1 are enhanced, and the device can be operated more stably.

(Second Embodiment)

Figure 19A:
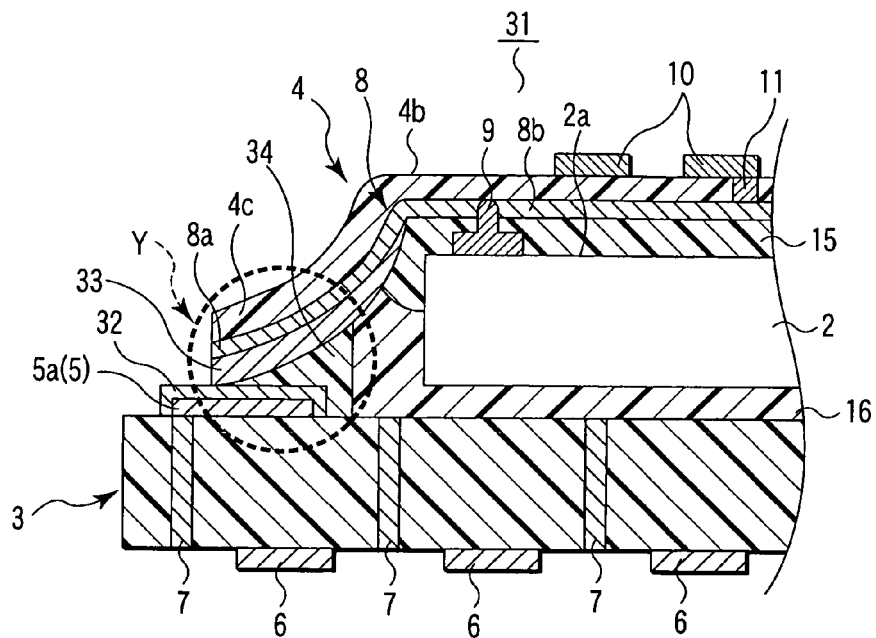
FIG. 19A is a sectional view showing a connection portion between the first internal wiring provided on the first substrate and the second internal wiring provided on the second substrate in the semiconductor device according to a second embodiment.
Figure 19B:
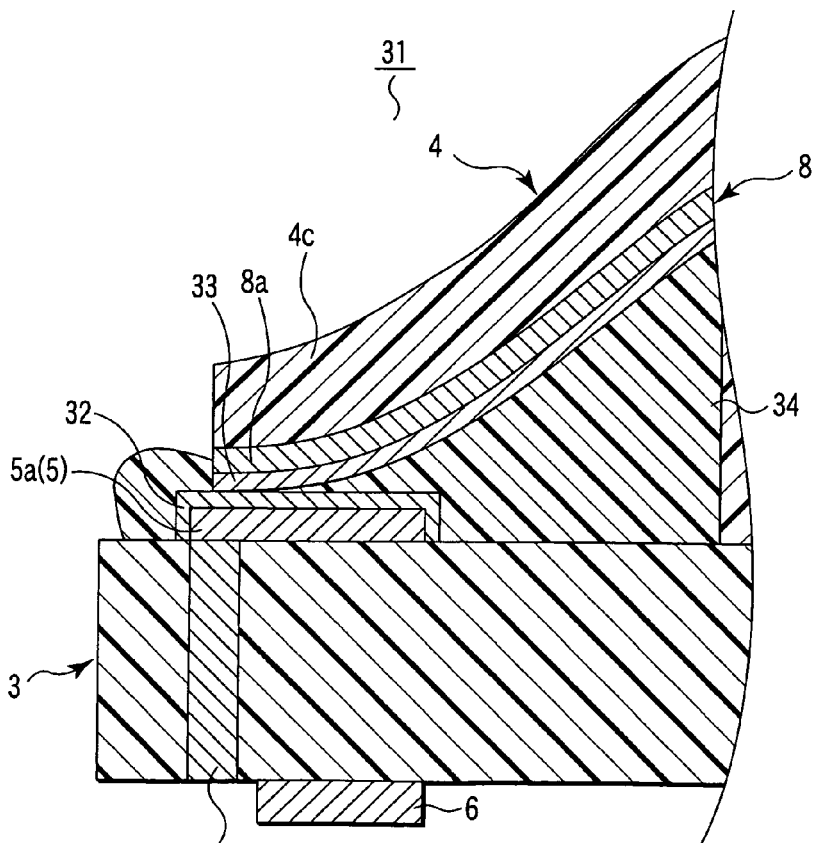
FIG. 19B is a sectional view showing the vicinity of a portion enclosed with a broken-line circle in FIG. 19A in the enlarged size.

Next, a second embodiment of the present invention will be described with reference to FIGS. 19A and 19B. FIGS. 19A and 19B are sectional views showing the connection portions between the first internal wirings provided on the first substrate and the second internal wirings provided on the second substrate in the semiconductor device of the present embodiment. It is to be noted that the same part as that of the first embodiment is denoted with the same reference numerals, and the detailed description is omitted.

The present embodiment is different from the first embodiment only in a method of connecting the connection terminals 5a of the first internal connection wirings 5 provided on the circuit substrate 3 to the connection terminals 8a of the second internal connection wirings 8 provided on the flexible substrate 4, and the other respect is similar to that of the first embodiment. The present embodiment will be described concretely hereinafter.

As shown in FIGS. 19A and 19B, the surfaces of the connection terminals 5a of the first internal connection wirings 5 provided on the circuit substrate 3 are substantially entirely coated with a solder portion 32 in a first semiconductor device 31 of the present embodiment. Similarly, the surfaces of the connection terminals 8a of the second internal connection wirings 8 provided on the flexible substrate 4 are substantially entirely coated with a solder portion 33. An adhesive 34 is provided between the circuit substrate 3 and the flexible substrate 4 except the connection portions between the connection terminals 5a of the first internal connection wirings 5 and the connection terminals 8a of the second internal connection wirings 8. In this constitution, the circuit substrate 3 is heated and press-bonded to the flexible substrate 4 from the outside of both the substrates. Accordingly, the connecting of the circuit substrate 3 to the flexible substrate 4, and the electric connecting of the connection terminals 5a of the first internal connection wirings 5 to the connection terminals 8a of the second internal connection wirings 8 are performed together. It is to be noted that FIG. 19B is a sectional view showing a part Y enclosed with a broken-line circle in FIG. 19A.

As described above, in accordance with the second embodiment, an effect similar to that of the first embodiment can be obtained.

(Third Embodiment)

Figure 20A:
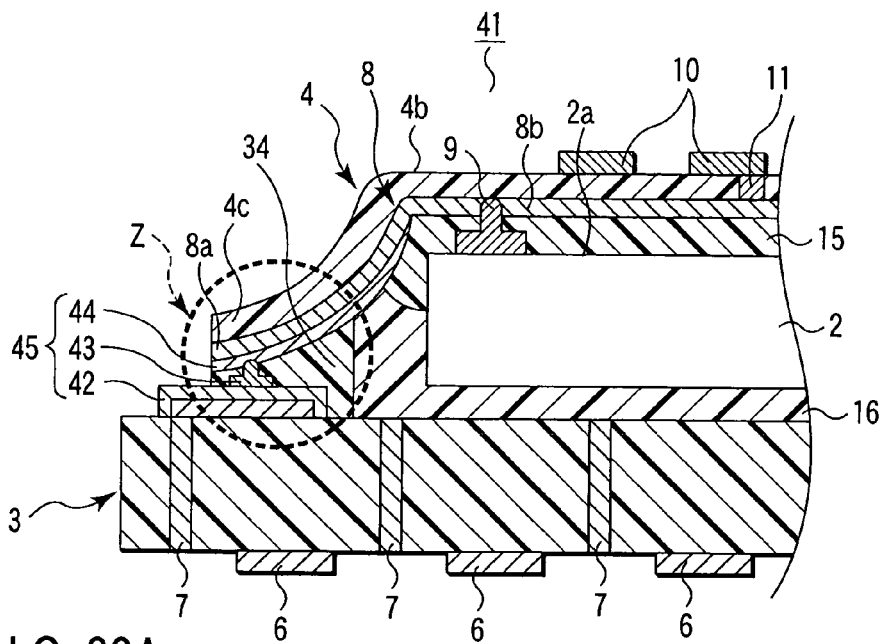
FIG. 20A is a sectional view showing the connection portion between the first internal wiring provided on the first substrate and the second internal wiring provided on the second substrate in the semiconductor device according to a third embodiment.
Figure 20B:
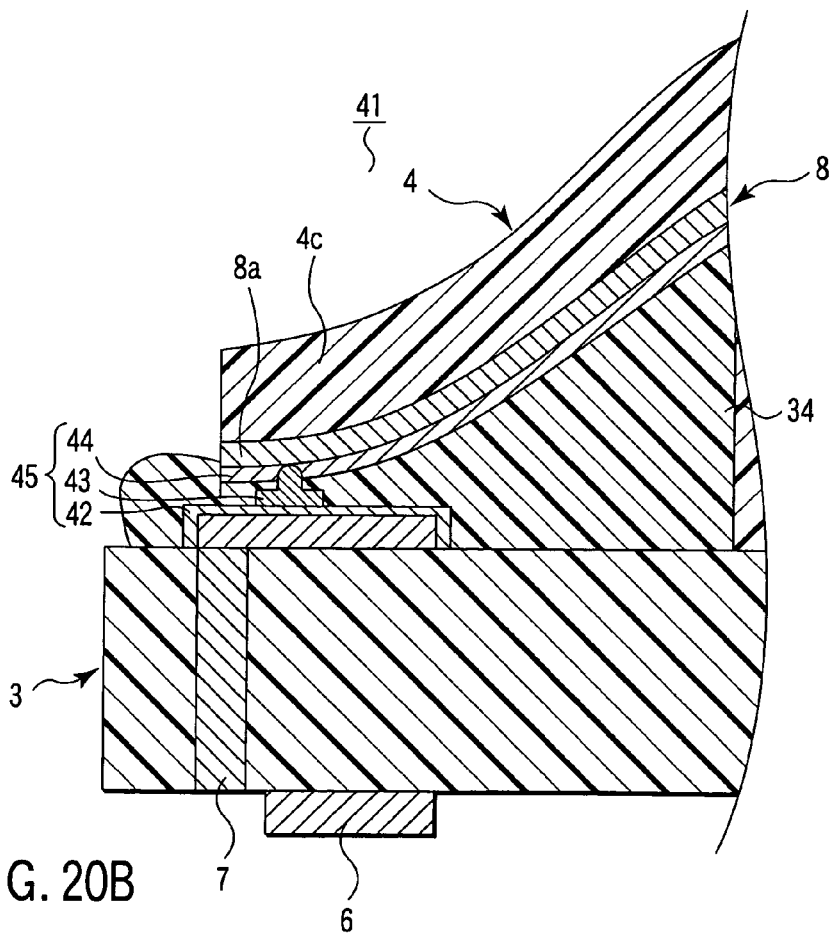
FIG. 20B is a sectional view showing the vicinity of a portion enclosed with a broken-line circle in FIG. 20A in the enlarged size.

Next, a third embodiment of the present invention will be described with reference to FIGS. 20A and 20B. FIGS. 20A and 20B are sectional views showing the connection portions between the first internal wirings provided on the first substrate and the second internal wirings provided on the second substrate in the semiconductor device of the present embodiment. It is to be noted that the same part as that of the first embodiment is denoted with the same reference numerals, and the detailed description is omitted.

The present embodiment is different from the first and second embodiments only in the method of connecting the connection terminals 5a of the first internal connection wirings 5 provided on the circuit substrate 3 to the connection terminals 8a of the second internal connection wirings 8 provided on the flexible substrate 4, and the other respects are similar to those of the first and second embodiments. The present embodiment will be described concretely hereinafter.

As shown in FIGS. 20A and 20B, the surfaces of the connection terminals 5a of the first internal connection wirings 5 provided on the circuit substrate 3 are substantially entirely coated with an Au plating portion 42 in a first semiconductor device 41 of the present embodiment. Moreover, an Au stud bump 43 formed in a convex shape toward the flexible substrate 4 is provided on the Au plating portion 42 of each connection terminal 5a. The surfaces of the connection terminals 8a of the second internal connection wirings 8 provided on the flexible substrate 4 are substantially entirely coated with an Sn plating portion 44. Furthermore, the adhesive 34 is provided between the circuit substrate 3 and the flexible substrate 4 except the connection portions between the connection terminals 5a of the first internal connection wirings 5 and the connection terminals 8a of the second internal connection wirings 8. In this constitution, the circuit substrate 3 is heated and press-bonded to the flexible substrate 4 from the outside of both the substrates. Accordingly, the bonding of the circuit substrate 3 to the flexible substrate 4, and the electric connecting of the connection terminals 5a of the first internal connection wirings 5 to the connection terminals 8a of the second internal connection wirings 8 are performed together. In this case, an Au—Sn alloy portion 45 comprising the Au plating portion 42, Au stud bump 43, and Sn plating portion 44 is formed on the connection portion between the connection terminal 5a of the first internal connection wiring 5 and the connection terminal 8a of the second internal connection wiring 8. It is to be noted that FIG. 20B is a sectional view showing a part Z enclosed with the broken-line circle in FIG. 20A.

As described above, in accordance with the third embodiment, the effects similar to those of the first and second embodiments can be obtained.

(Fourth Embodiment)

Figure 21:
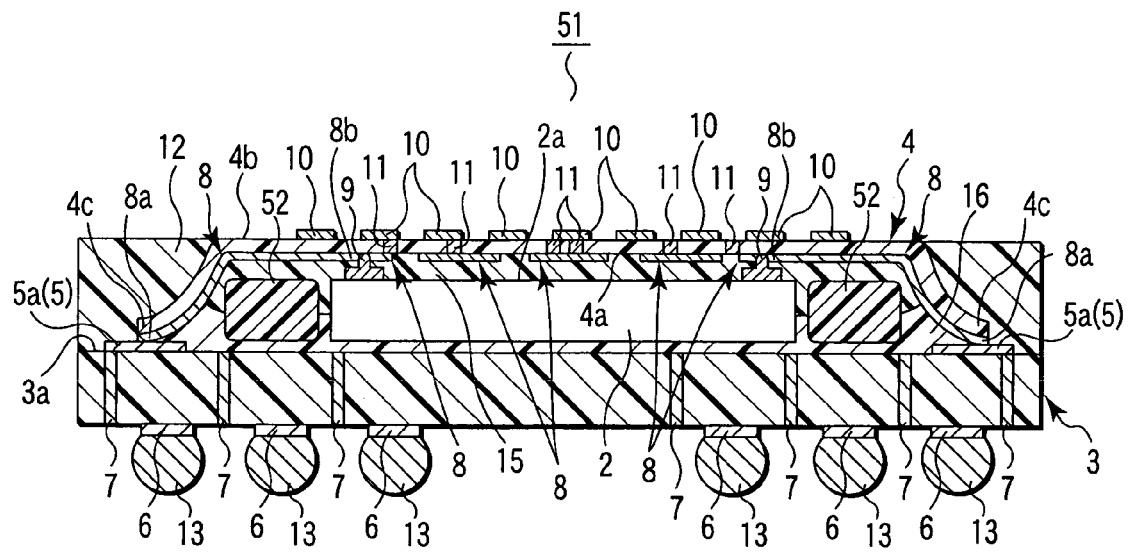
FIG. 21 is a sectional view showing the semiconductor device according to a fourth embodiment.

Next, a fourth embodiment of the present invention will be described with reference to FIG. 21. FIG. 21 is a sectional view showing the semiconductor device according to the present embodiment. It is to be noted that the same part as that of the first embodiment is denoted with the same reference numerals, and the detailed description is omitted.

The present embodiment is different from the first to third embodiments only in that the region (external connection surface 4b) of the flexible substrate 4 on which the upper connection terminals 10 are provided is spread, and the other respects are similar to those of the first to third embodiments. The present embodiment will be described concretely hereinafter.

As shown in FIG. 21, in a first semiconductor device 51 of the present embodiment, an expansion member (spacer) 52 is provided between the circuit substrate 3 and the flexible substrate 4 along an outer surface of the first semiconductor element 2. Concretely, the spacer 52 formed in an annular shape by a predetermined resin is provided in the outer peripheral portion of the first semiconductor element 2 for an area by which the external connection surface 4b of the flexible substrate 4 is further enlarged. Furthermore, the spacer 52 is bonded to the flexible substrate 4. Thereafter, the edges 4c of the flexible substrate 4 which do not face the first semiconductor element 2 and spacer 52 are bent toward the circuit substrate 3 by the process similar to that of the first embodiment. Moreover, the bonding of the circuit substrate 3 to the flexible substrate 4, and the electric connecting of the connection terminals 5a of the first internal connection wirings 5 to the connection terminals 8a of the second internal connection wirings 8 are performed together. Thereafter, the first semiconductor element 2, spacer 52, circuit substrate 3, and flexible substrate 4 are sealed by the mounting by the process similar to that of the first embodiment. Accordingly, the first semiconductor device 51 is obtained including the external connection surface 4b which is enlarged as compared with the first to third embodiments. Additionally, the first semiconductor device 51 is obtained including more upper connection terminals 10 whose degree of freedom in the arrangement is enhanced.

As described above, in accordance with the fourth embodiment, the effects similar to those of the first to third embodiments can be obtained. In the first to third embodiments, the external connection surface 4b is secured by the use of only the size of the first semiconductor element 2 to be mounted on the first semiconductor device 1, 31, or 41. Moreover, a plurality of upper connection terminals 10 are provided only in the area substantially equal to that of the main surface of the first semiconductor element 2. In recent years, further compacting of the semiconductor element has advanced, and this constitution has a possibility that it is difficult to provide a necessary/sufficient number of upper connection terminals 10. On the contrary, in the present embodiment, the spacer 52 having the size and shape such that the appropriate number of upper connection terminals 10 can be arranged with an appropriate interval and shape is provided around the first semiconductor element 2. Accordingly, even when the first semiconductor element 2 is further compact, the external connection surface 4b having the appropriate and necessary/sufficient size can be secured, and the appropriate and necessary/sufficient number of upper connection terminals 10 can be provided on the external connection surface 4b. That is, in accordance with the present embodiment, the above-described problem can be solved.

(Fifth Embodiment)

Figure 22:
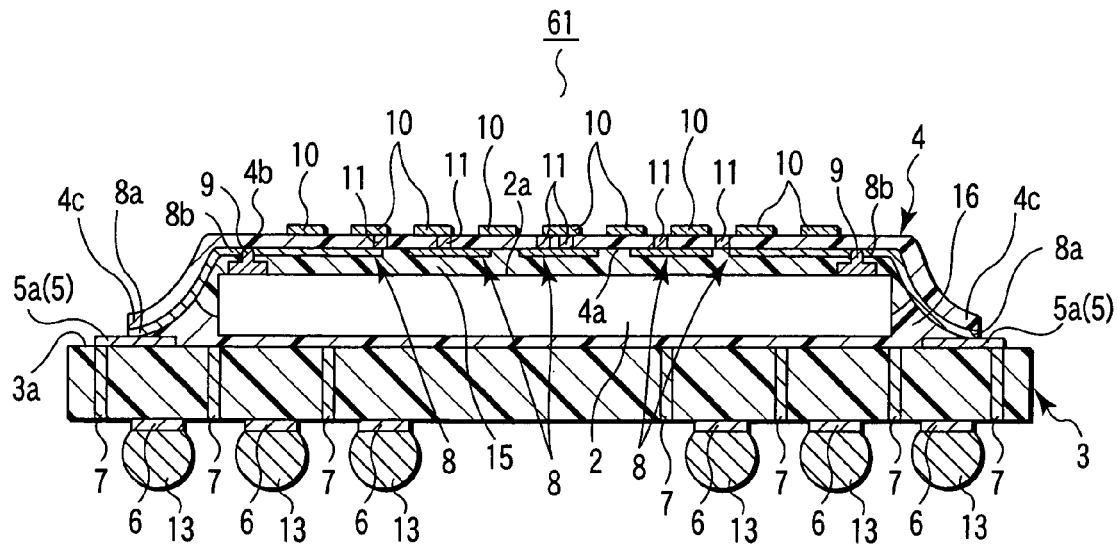
FIG. 22 is a sectional view showing the semiconductor device according to a fifth embodiment.

Next, a fifth embodiment of the present invention will be described with reference to FIG. 22. FIG. 22 is a sectional view showing the semiconductor device according to the present embodiment. It is to be noted that the same part as that of the first embodiment is denoted with the same reference numerals, and the detailed description is omitted.

In the present embodiment, different from the first to fourth embodiments, the molding/sealing is not performed. The other respects are similar to those of the first to fourth embodiments. The present embodiment will be described concretely hereinafter.

As shown in FIG. 22, in a first semiconductor device 61 of the present embodiment, the sealing resin for protection is not provided around the first semiconductor element 2, circuit substrate 3, or flexible substrate 4. When the circuit substrate 3 and the flexible substrate 4 are formed of the materials having the high resistance to various physical or chemical external actions such as shock and heat from the outside and capable of protecting the first semiconductor element 2, it is not necessary to provide the sealing resin as in the present embodiment.

As described above, in accordance with the fifth embodiment, the effects similar to those of the first to fourth embodiments can be obtained. Since the molding/sealing does not have to be performed, it is possible to easily manufacture the first semiconductor device 61 at lower cost and with higher yield.

(Sixth Embodiment)

Next, a sixth embodiment of the present invention will be described with reference to FIG. 23. FIG. 23 is a plan view showing the semiconductor device according to the present embodiment seen from a second substrate side. It is to be noted that the same part as that of the first embodiment is denoted with the same reference numerals, and the detailed description is omitted.

In the present embodiment, different from the first to fifth embodiments, at least one second external wiring fur use in a predetermined application different from that of each upper connection terminal 10 is provided on the flexible substrate 4. The other respects are similar to those of the first to fifth embodiments. The present embodiment will be described concretely hereinafter.

As shown in FIG. 23, in a first semiconductor device 71 of the present embodiment, a plurality of second external wirings (upper wirings) 72 for use in the predetermined applications different from those of the upper connection terminals 10 are provided on the external connection surface 4b of the flexible substrate 4. Concretely, in addition to a BGA mounting pattern which is each upper connection terminal 10, a passive component mounting pattern 72a, a short-circuit pattern 72b, a circuit cut pattern 72c and the like are provided on the region of the external connection surface 4b in which the upper connection terminals 10 are not provided.

As described above, in accordance with the sixth embodiment, the effects similar to those of the above-described first to fifth embodiments can be obtained. When the passive component mounting pattern 72a, short-circuit pattern 72b, circuit cut pattern 72c and the like are provided on the external connection surface 4b of the flexible substrate 4, a rich variety of another electric component that can be combined with the first semiconductor device 71 is obtained. Moreover, when the type or wiring pattern of the upper wiring 72 is devised, the variation of the first semiconductor device 71 can be increased. Accordingly, it is possible to more easily manufacture a more inexpensive mixed/loaded type semiconductor device without especially manufacturing any new device or component in accordance with the purpose or the application.

It is to be noted that the semiconductor device and the manufacturing method of the present invention are not limited to the first to sixth embodiments. Some of the constitutions and manufacturing processes can be changed to various settings, or various settings can appropriately be combined or used and carried out without departing from the scope of the present invention.

For example, in the first embodiment, one semiconductor element 2 or 26 is mounted on the first semiconductor device 1 or second semiconductor device 25, but the present invention is not limited to this. The number of semiconductor elements 2 or 26 to be mounted on the first semiconductor device 1 or second semiconductor device 25 may be appropriately set to a suitable number in accordance with desired specifications of the semiconductor device. In this case, the semiconductor elements 2 or 26 may also be stacked in the semiconductor device 1 or 25, or the semiconductor elements 2, 26 may also be arranged along the main surface of each circuit substrate 3. The arrangement of the semiconductor elements 2, 26 may also appropriately be set to suitable positions in accordance with the desired specifications of the semiconductor device. Moreover, the type of the semiconductor element 2 or 26 to be mounted on the first semiconductor device 1 or the second semiconductor device 25 is not limited to the same type in the semiconductor device 1 or 25. Various types of semiconductor elements 2, 26 may be mixed/loaded in the respective semiconductor devices 1, 25 in accordance with the desired specifications of the semiconductor devices.

Moreover, during the molding/sealing, predetermined films may be adsorbed onto the surfaces 23b, 23c of the upper mold 23 facing the circuit substrate 3 and flexible substrate 4 to perform the molding/sealing, that is, a so-called sheet molding method may also be performed. In accordance with the sheet molding method, it is possible to more securely expose the upper connection terminals 10 by an effect of a cushion property of the sheet.

Furthermore, it is possible to prepare the circuit substrate 3 which is the first substrate by a substrate comprising a glass epoxy base material or BT resin base material, or a flexible substrate comprising a polyimide base material in the same manner as in the flexible substrate 4. Moreover, the circuit substrate 3 and flexible substrate 4 may also be formed in a film or tape shape. In accordance with the constitution, it is possible to prepare the semiconductor device 1 with a remarkably small thickness or to attach the semiconductor device 1 to various places. That is, the lightening, compacting, and space saving of the semiconductor device 1 can remarkably be enhanced substantially without sacrificing any high stacking property (mounting property) of the semiconductor device 1. As a result, the general-purpose property of the semiconductor device 1 can remarkably be enhanced.

Furthermore, the spacer 52 provided in the fourth embodiment is not limited to the above-described annular shape. The spacer 52 may also appropriately be set to a suitable shape and size in accordance with a required shape and size of the external connection surface 4b. For example, the spacer 52 does not have to be provided so as to surround the whole outer peripheral portion of the first semiconductor element 2. The spacer 52 may also be formed and provided in the shape and size such that at least a part of the outer peripheral portion of the first semiconductor element 2 is surrounded, in accordance with a required shape and size of the external connection surface 4b. Moreover, the material forming the spacer 52 is not limited to the resin. Needless to say, the spacer 52 may be formed of a metal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
    at least one semiconductor element;
    a first substrate being disposed to face one main surface of the semiconductor element, being provided a plurality of first internal wirings on a main surface of the first substrate on a side facing the semiconductor element, and being provided a plurality of first external wirings being electrically connected to the respective first internal wirings on a main surface of the first substrate on a side opposite to the side facing the semiconductor element; and
    a second substrate being formed to be larger than both main surfaces of the semiconductor element by a material having flexibility, being disposed to hold the semiconductor element between the first substrate and the second substrate, being provided a plurality of second internal wirings having one-end portions extended to edges of a main surface of the second substrate on a side facing the semiconductor element on the main surface of the second substrate on the side facing the semiconductor element, and the one-end portions of the second internal wirings electrically connected to the first internal wirings with being bent toward the first substrate together with the edges of the second substrate on which the second internal wirings are provided, being mounted the semiconductor element having at least one electrode electrically connected to some of the second internal wirings on the main surface of the second substrate on the side facing the semiconductor element, and being provided a plurality of external terminals being electrically connected to some of the second internal wirings on at least a middle part of a main surface of the second substrate on a side opposite to the side on which the semiconductor element is mounted.

2. The device according to claim 1, further comprising:
    Au plating portions provided on the surfaces of connection portions of the first and second internal wirings; and a conductive member provided between the Au plating portions of the first and second internal wirings, wherein the first internal wirings are electrically connected to the second internal wirings via the Au plating portions and the conductive member.

3. The device according to claim 2, wherein;
    the conductive member is an anisotropic conductive sheet including a plurality of anisotropic conductive particles.

4. The device according to claim 3, wherein;
    the anisotropic conductive particles are at least a plurality of Ni particles or a plurality of plastic balls on whose surfaces Au plating portions are provided.

5. The device according to claim 1, further comprising:
solder portions provided on the surfaces of connection portions of the first and second internal wirings, wherein the first internal wirings are electrically connected to the second internal wirings via the solder portions.

6. The device according to claim 1, further comprising:
Au plating portions provided on the surfaces of connection portions between the first internal wirings and the second internal wirings and Au bumps provided on the surfaces of the Au plating portions, Sn plating portions provided on the surfaces of the connection portions of the second internal wirings to the first internal wirings, wherein the first internal wirings are electrically connected to the second internal wirings via Au—Sn alloy portions, and the Au—Sn alloy portions are formed by thermally press-bonding the Au plating portions, the Au bumps, and the Sn plating portions.

7. The device according to claim 1, further comprising:
a plurality of first plugs provided through the first substrate along a thickness direction of the first substrate and a plurality of second plugs provided through the second substrate along the thickness direction of the second substrate, wherein the first internal wirings are electrically connected to the first external wirings in predetermined patterns via the first plugs, and the second internal wirings are electrically connected to the external terminals in predetermined patterns via the second plugs.

8. The device according to claim 1, wherein;
at least one of the electrodes of the semiconductor element is electrically connected to the external terminals.

9. The device according to claim 1, further comprising:
a sealing member provided to coat the semiconductor element, the main surface of the first substrate facing the semiconductor element, and the substrate of the second substrate except the end surfaces of at least the external terminals.

10. The device according to claim 1, further comprising:
at least one expansion member provided between the first substrate and the second substrate, wherein the expansion member is provided along at least a part of an outer surface of the semiconductor element, and a portion of the second substrate except a region facing the semiconductor element and the expansion member is bent toward the second substrate.

11. The device according to claim 1, further comprising:
at least one second external wiring provided on the main surface of the second substrate on which the external terminals are provided, wherein the second external wiring is used in a predetermined application different from that of the external terminal, and the second external wiring is electrically disconnected from the external terminals.

12. The device according to claim 1, wherein;
the second substrate is formed by use of at least one type of material selected from a group consisting of glass epoxy, polyimide, BT resin, and PCB.

13. The device according to claim 1, further comprising:
another electric component mounted on the main surface of the second substrate on which the external terminals are provided, the another electric component being electrically connected to the external terminals.

14. The device according to claim 13, wherein;
the other electric component is another semiconductor device.

\* \* \* \* \*